United States Patent
Park et al.

(10) Patent No.: US 9,548,260 B2
(45) Date of Patent: Jan. 17, 2017

(54) SEMICONDUCTOR DEVICES INCLUDING CONDUCTIVE PLUG

(71) Applicant: Samsung Electronics Co., Ltd., Suwon-Si, Gyeonggi-Do (KR)

(72) Inventors: Je-min Park, Suwon-si (KR); Dae-ik Kim, Hwaseong-si (KR); Ji-young Kim, Yongin-si (KR); Nak-jin Son, Suwon-si (KR); Yoo-sang Hwang, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 219 days.

(21) Appl. No.: 14/175,305

(22) Filed: Feb. 7, 2014

(65) Prior Publication Data

US 2014/0252440 A1    Sep. 11, 2014

(30) Foreign Application Priority Data

Mar. 7, 2013    (KR) .................. 10-2013-0024544

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/485* | (2006.01) | |
| *H01L 27/108* | (2006.01) | |
| *H01L 21/768* | (2006.01) | |
| *H01L 29/417* | (2006.01) | |

(52) U.S. Cl.
CPC ....... *H01L 23/485* (2013.01); *H01L 21/76897* (2013.01); *H01L 27/10814* (2013.01); *H01L 27/10855* (2013.01); *H01L 27/10888* (2013.01); *H01L 27/10876* (2013.01); *H01L 29/41791* (2013.01); *H01L 2924/0002* (2013.01)

(58) Field of Classification Search
CPC ............ H01L 23/485; H01L 21/76897; H01L 27/10814; H01L 27/10855; H01L 27/10888
USPC ....... 257/208, 288, 290, 296, 315, 751, 758, 257/760, 774; 438/183, 586
See application file for complete search history.

(56) References Cited

U.S. PATENT DOCUMENTS

| | | | |
|---|---|---|---|
| 5,521,113 A | 5/1996 | Hsue et al. | |
| 8,053,272 B2 | 11/2011 | Ohtani et al. | |
| 2005/0104232 A1* | 5/2005 | Shih ..................... | H01L 27/115 257/296 |

(Continued)

FOREIGN PATENT DOCUMENTS

| | | |
|---|---|---|
| JP | 2003332347 A | 11/2003 |
| JP | 2006100378 A | 4/2006 |

(Continued)

*Primary Examiner* — Errol Fernandes
(74) *Attorney, Agent, or Firm* — Harness, Dickey & Pierce, PLC

(57) ABSTRACT

Semiconductor devices include a substrate having a target connection region; a conductive line having a first side wall spaced apart from the substrate by at least an insulating layer, and a conductive plug structure electrically connecting the conductive line to the target connection region, wherein the conductive plug includes a first conductive plug having a first side wall, a bottom surface contacting the target connection region of the substrate, and a second side wall facing the first side wall of the conductive line, and a second conductive plug between the conductive line and the first conductive plug. The second conductive plug contacts both the first side wall of the conductive line and the second side wall of the first conductive plug.

14 Claims, 27 Drawing Sheets

(56) References Cited

U.S. PATENT DOCUMENTS

| | | |
|---|---|---|
| 2007/0034970 A1 | 2/2007 | Jin et al. |
| 2007/0210339 A1 | 9/2007 | Narasimhan et al. |
| 2008/0087932 A1* | 4/2008 | Son ............... H01L 21/8221 |
| | | 257/315 |
| 2011/0316056 A1 | 12/2011 | Iwasa |

FOREIGN PATENT DOCUMENTS

| | | |
|---|---|---|
| KR | 20070045570 A | 5/2007 |
| KR | 20100073351 A | 7/2010 |
| KR | 20110077380 A | 7/2011 |

* cited by examiner

SEMICONDUCTOR DEVICES INCLUDING CONDUCTIVE PLUG

CROSS-REFERENCE TO RELATED APPLICATIONS

This application claims the benefit of priority from Korean Patent Application No. 10-2013-0024544, filed on Mar. 7, 2013, in the Korean Intellectual Property Office, the disclosure of which is incorporated herein in its entirety by reference.

BACKGROUND

Field

Example embodiments of the inventive concepts relate to a semiconductor device, and more particularly, to a semiconductor device including a conductive plug.

Description of Related Art

As the electronic industry has grown dramatically and demands of users have increased, electronic devices have become smaller and lighter. Accordingly, semiconductor devices used in electronic devices have higher degrees of integration, and thus design rules for elements of semiconductor devices are reduced. When a conductive plug (contact plug) for connecting a conductive line and a structure disposed under the conductive line is formed in a semiconductor device that is miniaturized to have a high degree of integration, it is difficult to ensure contact resistance, which is important in order for the semiconductor device to have sufficient reliability.

SUMMARY

Some example embodiments of the inventive concepts provide a semiconductor device including a conductive plug that ensures contact resistance.

According to an example embodiment of the inventive concepts, there is provided a semiconductor device comprising a substrate including a target connection region, a conductive line having a first side wall, the conductive line being spaced apart from the substrate by at least an insulating layer, and a conductive plug structure electrically connecting the conductive line to the target connection region, the conductive plug structure including a first conductive plug having a first side wall, a bottom surface contacting the target connection region of the substrate, and a second side wall facing the first side wall of the conductive line, and a second conductive plug between the conductive line and the first conductive plug, the second conductive plug contacting both the first side wall of the conductive line and the second side wall of the first conductive plug.

The second conductive plug may extend into the insulating layer along the first side wall of the conductive line.

The second conductive plug may penetrate the insulating layer and contacts the target connection region of the substrate.

The second conductive plug may contact a top surface and the first side wall of the conductive line.

The second conductive plug may contact a top surface and the second side wall of the first conductive plug.

The first conductive plug and the second conductive plug may have top surfaces at a same level based on a distance from the substrate.

The target connection region may be an active region, and the conductive line may be a bit line or a word line.

The substrate may have a recess region crossing the target connection region in plan view, and the recess region may extend in a direction different from a direction in which the conductive line extends in plan view. The direction in which the conductive line extends may be parallel to a main surface of the substrate, and a buried gate line may be in the recess region.

The target connection region may include a first connection region contacting the first conductive plug, and a second connection region spaced apart from the first connection region by the buried gate line, and a third conductive plug may contact the second connection region, and a capacitor structure may be on, and connected to the third conductive plug.

The conductive line may extend in a first direction, and a plurality of the target connection regions are aligned on the substrate in a second direction. The second direction may be different from the first direction.

A plurality of the conductive plug structures may each be aligned in the first direction to correspond to a respective one of the plurality of target connection regions.

The target connection region may be an active region of the substrate, and the conductive line may be a gate line.

The target connection region may be a wiring line over the substrate, and the conductive line may be over the wiring line.

According to another example embodiment of the inventive concepts, there is provided a semiconductor device comprising a substrate including a target connection region, an insulating layer over the substrate, a first conductive line structure and a second conductive line structure each over the insulating layer, each of the first and second conductive line structures including a conductive line, a capping layer over the conductive line, and a spacer layer covering at least side wall of the conductive line, and the first conductive line structure and the second conductive line structure extending in a direction parallel to a main surface of the substrate and spaced apart from each other, and a first conductive plug and a second conductive plug between the first conductive line structure and the second conductive line structure, the first conductive plug contacting the spacer layer of the second conductive line structure and extending toward the substrate such that the first conductive plug is connected to the target connection region, and the second conductive plug penetrating the spacer layer of the first conductive line structure to contact a side wall of the conductive line of the first conductive line structure, and contacting the first conductive plug such that the second conductive plug is electrically connected to the target connection region.

The spacer layer may include a spacer made of air.

According to a further example embodiment, a semiconductor device includes a substrate having a target connection region, a conductive line structure pattern insulated from the substrate, and a conductive plug electrically connecting the conductive line structure pattern to the target connection region. The conductive plug includes a first region and a second region electrically connected to each other. A bottom surface of the first region contacts the target connection region. The conductive line structure pattern contacts a side of the second region.

A bottom surface of the second region may contact the target connection region.

The conductive line structure pattern may have a recess filled in by the conductive plug.

The conductive line structure pattern may include at least one conductive line structure. The at least one conductive line structure may include a conductive line having a first sidewall contacting the side of the second region, and a first spacer on a second sidewall of the conductive line and contacting the substrate. The second sidewall of the conductive line opposes the first sidewall of the conductive line. An insulating layer may be interposed between the conductive line and the target connection region.

The semiconductor device may further include a second spacer. A bottom surface of the second region may contact at least one of the second spacer and the insulating layer.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
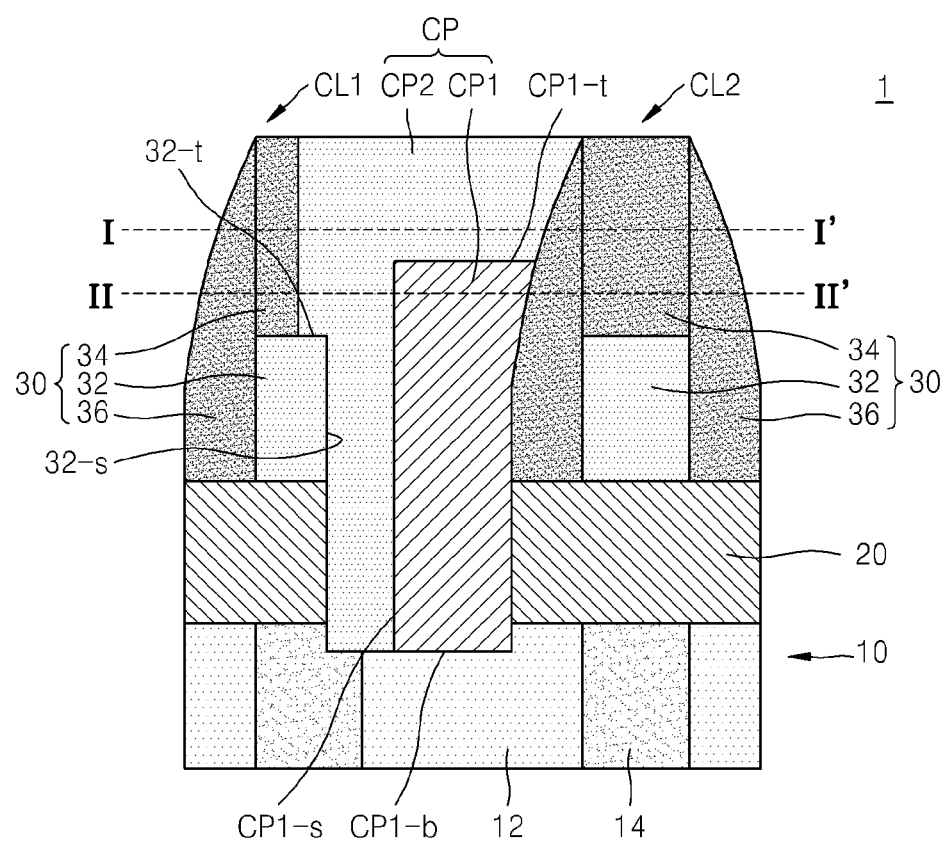
FIGS. 1 through 4 are cross-sectional views illustrating semiconductor devices including conductive plugs according to some example embodiments of the inventive concepts.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various features will be described in detail with reference to the attached drawings. However, example embodiments described are not limited thereto.

Hereinafter, the inventive concepts will be described more fully with reference to the accompanying drawings, in which example embodiments of the inventive concepts are shown.

FIGS. 1 through 4 are cross-sectional views illustrating semiconductor devices including conductive plugs, according to an example embodiment of the inventive concepts.

Referring to FIG. 1, a semiconductor device 1 includes a conductive line 32 and a conductive plug CP which are formed on a substrate 10 including a target connection region 12. The conductive plug structure CP may electrically connect the conductive line 32 to the target connection region 12. The conductive line 32 may be spaced apart from the substrate 10 with an insulating layer 20 therebetween.

The substrate 10 may include a device-isolating region 14 and the target connection region 12 that is defined by the device-isolating region 14. The target connection region 12 may be, for example, an active region.

The semiconductor device 1 may include a plurality of conductive line structures 30 each including the conductive line 32. The plurality of conductive line structures 30 may include a first conductive line structure CL1 and a second conductive line structure CL2. The first conductive line structure CL1 and the second conductive line structure CL2 may collectively form a conductive line structure pattern. The insulating layer 20 may be formed on (or, alternatively, over) the substrate 10, and the first conductive line structure CL1 and the second conductive line structure CL2 may be formed on (or, alternatively, over) the insulating layer 20.

Each of the first and second conductive line structures CL1 and CL2 may include the conductive line 32, a capping layer 34 formed on the conductive line 32, and a spacer layer 36 that covers both side walls of the conductive line 32. The first conductive line structure CL1 and the second conductive line structure CL2 may be spaced apart from each other and extend in the same direction that is parallel to a main surface of the substrate 10. The conductive line 32 may be, for example, a bit line or a word line.

The conductive plug structure CP may include a first conductive plug CP1 and a second conductive plug CP2. The first conductive plug CP1 may have a bottom surface CP-b that contacts the target connection region 12 of the substrate 10, and a second side wall CP1-s that faces a first side wall 32-s of the conductive line 32 of the first conductive line structure CL1. According to an example embodiment, the upper surface of the substrate 10 may be non-planar such that the bottom surface CP-b, which contacts the target connection region 12 of the substrate 10, is recessed within the target connection region 12. According to another example embodiment, an upper surface of the substrate 10 may be planar and the bottom surface CP-b contacts the planar upper surface of the substrate 10. The second conductive plug CP2 may be disposed between the conductive line 32 of the first conductive line structure CL1 and the first conductive plug CP1, and may contact both the first side wall 32-s of the conductive line 32 and the second side wall CP1-s of the first conductive plug CP1.

The first conductive plug CP1 may contact the spacer layer 36 of the second conductive line structure CL2. That is, the second side wall CP1-s of the first conductive plug CP1 may contact the second conductive plug CP2, and a side wall opposite to the second side wall CP1-s of the first conductive plug CP1 may contact the spacer layer 36 of the second conductive line structure CL2. The first conductive plug CP1 may extend toward the substrate 10 to be connected to the target connection region 12. Accordingly, the first conductive plug CP1 may penetrate the insulating layer 20.

The second conductive plug CP2 may penetrate the spacer layer 36 of the first conductive line structure CL1 to contact the first side wall 32-s of the conductive line 32 of the first conductive line structure CL1 and also contact the second side wall CP1-s of the first conductive plug CP1. The second conductive plug CP2 may be electrically connected to the target connection region 12 through the first conductive plug CP1, and the conductive line 32 of the first conductive line structure CL1 may be electrically connected to the target connection region 12 through the second conductive plug CP2 and the first conductive plug CP1.

The second conductive plug CP2 may extend into the insulating layer 20 along the first side wall 32-s of the conductive line 32 of the first conductive line structure CL1. Also, the second conductive plug CP2 may penetrate the insulating layer 20 to contact the target connection region 12 of the substrate 10.

The second conductive plug CP2 may contact a top surface 32-t and the first side wall 32-s of the conductive line 32 of the first conductive line structure CL1. Also, the second conductive plug CP2 may contact a top surface CP1-t and the second side wall CP1-s of the first conductive plug CP1.

The conductive line 32 of the first conductive line structure CL1 may be electrically connected to the target connection region 12 through the second conductive plug CP2. Also, the conductive line 32 of the first conductive line structure CL1 may be electrically connected to the target connection region 12 through the second conductive plug CP2 and the first conductive plug CP1 that contacts the second conductive plug CP2.

The first conductive plug CP1 may be self-aligned with the spacer layer 36 of each of the first conductive line structure CL1 and the second conductive line structure CL2 before the second conductive plug CP2 is formed. Accordingly, the first conductive plug CP1 may contact the target connection region 12 to have a sufficient contact area. After the first conductive plug CP1 is formed, the second conductive plug CP2 may be formed by exposing the first side wall 32-s of the conductive line 32 of the first conductive line structure CL1 and the second side wall CP1-s of the first conductive plug CP2 and then by being forced to contact the exposed first side wall 32-s of the conductive line 32 of the first conductive line structure CL1 and the exposed second side wall CP1-s of the first conductive plug CP1.

The target connection region 12 and the conductive line 32 of the first conductive line structure CL1 may be electrically connected to each other through the second conductive plug CP2, and may also be electrically connected to each other through the second conductive plug CP2 and the first conductive plug CP1.

In detail, the conductive line 32 of the first conductive line structure CL1 may contact the second conductive plug CP2 through the first side wall 32-s, and the second conductive plug CP2 may contact the target connection region 12 to be electrically connected to the target connection region 12. The second conductive plug CP2 may contact the first conductive plug CP1 through the second side wall CP1-s of the first conductive plug CP1, and the bottom surface CP1-b of the first conductive plug CP1 may contact the target connection region 11 to be electrically connected to the target connection region 12.

Accordingly, contact resistance necessary in order for the semiconductor device 1 to have sufficient reliability may be ensured without being affected by misalignment occurring in a process of forming the second conductive plug CP2.

Although two conductive line structures, that is, the first conductive line structure CL1 and the second conductive line structure CL2, are illustrated and only the conductive line 32 of the first conductive line structure CL1 is electrically connected to the target connection area 12 through the conductive plug structure CP in FIG. 1 for easy explanation, the number of conductive line structures may be three or more, and the conductive line 32 of the second conductive line structure CL2 may also be electrically connected to the target connection region 12 through a conductive plug identical or similar to that of the conductive line 32 of the first conductive line structure CL1.

In detail, although the second conductive line structure CL2 is formed such that the capping layer 34 and the spacer layer 36 are symmetrical in a horizontal direction, the capping layer 34 and the spacer layer 36 of the second conductive line structure CL2 may be different from each other in the horizontal direction, like the capping layer 34 and the spacer layer 36 of the first conductive line structure CL1, and the conductive line 32 of the second conductive line structure CL2 which is exposed by the spacer layer 36 may be connected to a conductive plug.

Figure 2:
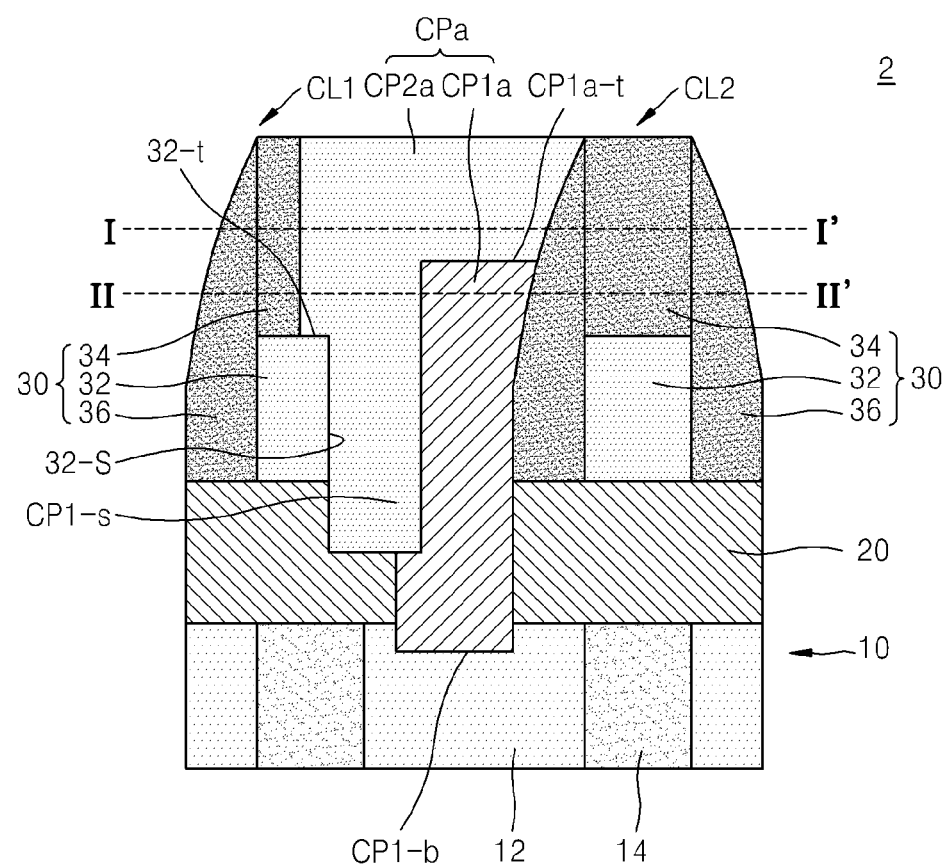
Figure 3:
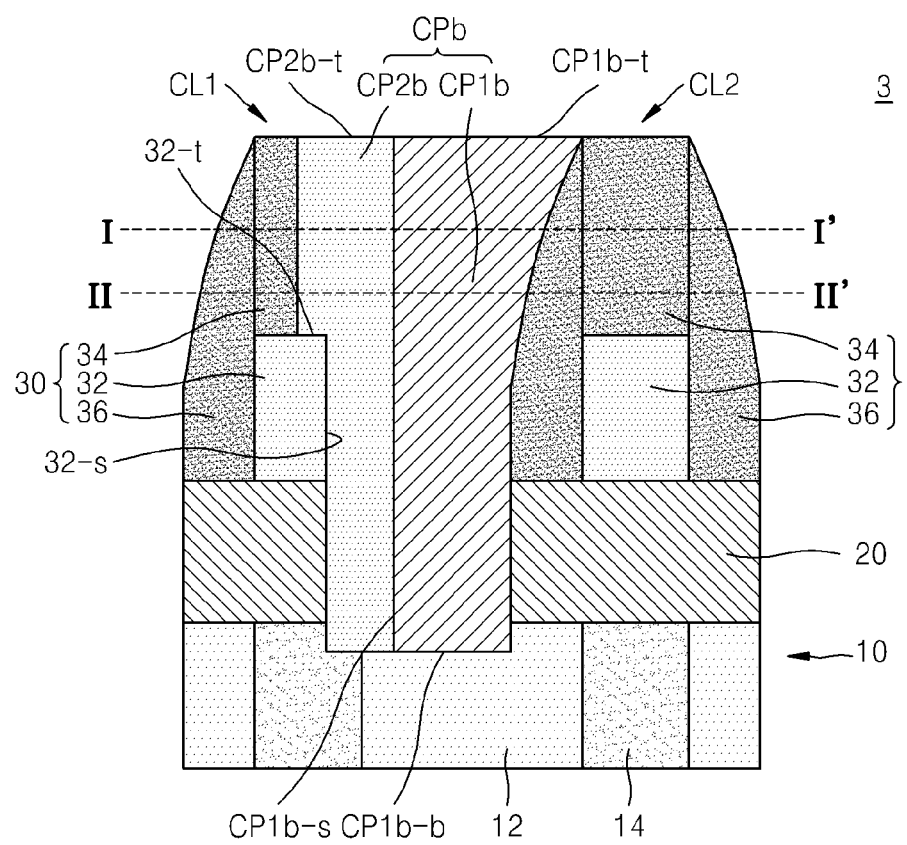
Figure 4:
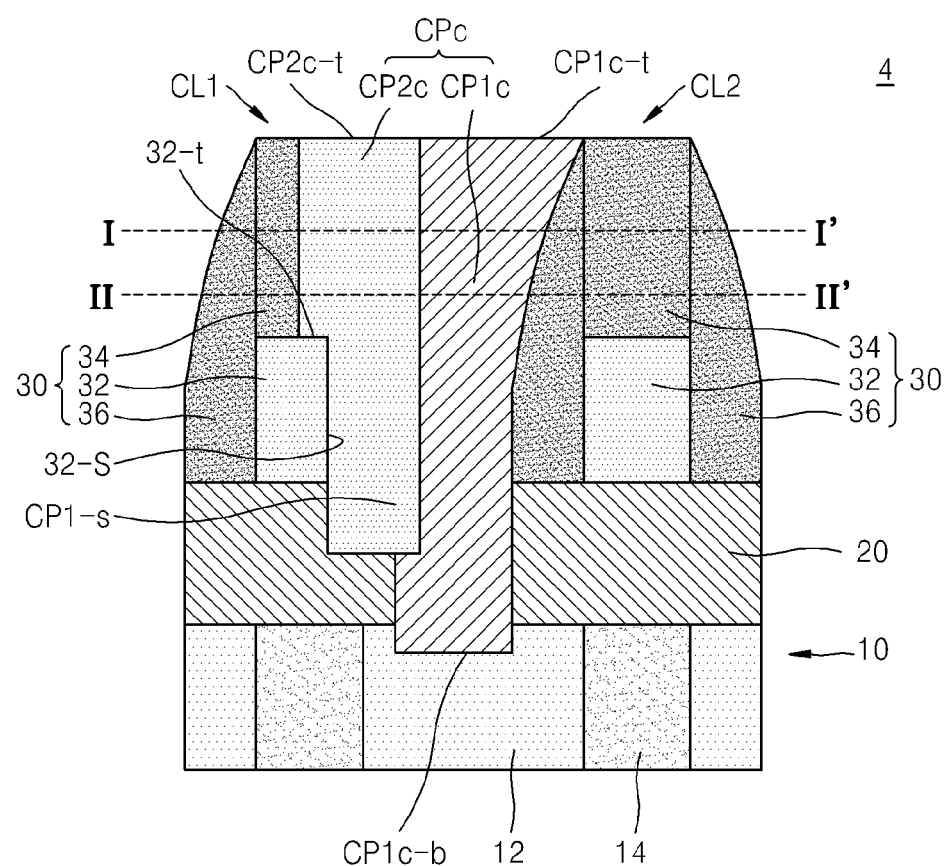

FIGS. 2 through 4 are cross-sectional views illustrating other example embodiments of the semiconductor device of FIG. 1, and thus a repeated explanation will not be given.

Referring to FIG. 2, a semiconductor device 2 includes the conductive line 32 and a conductive plug structure CPa which are formed on the substrate 10 including the target connection region 12. The conductive plug structure CPa may include a first conductive plug CP1a and a second conductive plug CP2a.

The second conductive plug CP2a may extend into the insulating layer 20 along the first side wall 32-s of the conductive line 32 of the first conductive line structure CL1. However, unlike the second conductive plug CP2 of FIG. 1, the second conductive plug CP2a of FIG. 2 may not penetrate the insulating layer 20 and may not directly contact the target connection region 12 of the substrate 10.

Even when the second conductive plug CP2a does not directly contact the target connection region 12 of the substrate 10, the first conductive plug CP1a that is self-aligned with the spacer layer 36 of each of the first conductive line structure CL1 and the second conductive line structure CL2 may have a sufficient contact area with the target connection region 12 of the substrate 10. Because the second conductive plug CP2a contacts a second side wall CP1a-s of the first conductive plug CP1a, contact resistance necessary in order for the semiconductor device 2 to have sufficient reliability may be ensured between the conductive line 32 of the first conductive line structure CL1 and the target connection region 12 of the substrate 10.

Referring to FIG. 3, a semiconductor device 3 includes the conductive line 32 and a conductive plug structure CPb which are formed on the substrate 10 including the target connection region 12. The conductive plug structure CPb may include a first conductive plug CP1b and a second conductive plug CP2b.

Unlike the second conductive plug CP2 of FIG. 1, the second conductive plug CP2b of FIG. 3 may not contact a top surface CP1b-t of the first conductive plug CP1b. The top surface CP1b-t of the first conductive plug CP1b and a top surface CP2b-t of the second conductive plug CP2b may be on the same level from the substrate 10.

Referring to FIG. 4, a semiconductor device 4 includes the conductive line 32 and a conductive plug structure CPc which are formed on the substrate 10 including the target connection region 12. The conductive plug structure CPc may include a first conductive plug CP1c and a second conductive plug CP2c.

Unlike the second conductive plug CP2b of FIG. 3, like the second conductive plug CP2a of FIG. 2, the second conductive plug CP2c of FIG. 4 may not penetrate the insulating layer 20 and may not directly contact the target connection region 12 of the substrate 10, like the second conductive plug CP2a of FIG. 2.

In a process of manufacturing the semiconductor devices 1, 2, 3, and 4 of FIGS. 1 through 4, an upper portion over a line I-I' or II-II' may be removed. When the upper portion over the line I-I' is removed, the second conductive plugs CP2 and CP2a of the first and second semiconductor devices 1 and 2 may respectively contact the top surfaces CP1-t and CP1a-t of the first conductive plugs CP1 and CP1a. However, when the upper portion over the line II-II' is removed, the first conductive plugs CP1, CP1a, CP1b, and CP of the semiconductor devices 1, 2, 3, and 4 of FIGS. 1 through 4 may have top surfaces that are on the same level as the second conductive plugs CP2, CP2a, CP2b, and CP2c.

Accordingly, whether the second conductive plugs CP2, CP2a, CP2b, and CP2c contact top surfaces of the first conductive plugs CP1, CP1a, CP1b, and CP1c may be determined by a method of forming the first conductive plugs CP1, CP1a, CP1b, and CP and the second conductive plugs CP2, CP2a, CP2b, and CP2c and also by a manufacturing process after the first conductive plugs CP1, CP1a, CP1b, and CP1c and the second conductive plugs CP2, CP2a, CP2b, and CP2c are formed.

The semiconductor devices 1, 2, 3, and 4 of FIGS. 1 through 4 may be memory devices, for example, dynamic random-access memory (DRAM) devices.

Figure 5:
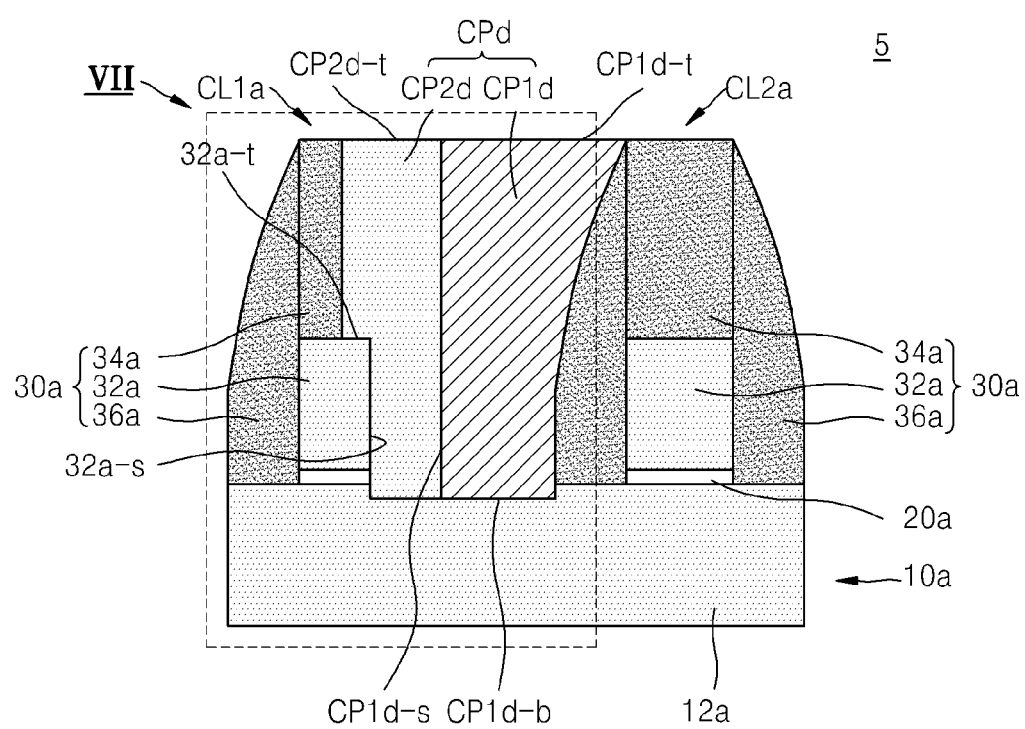
FIGS. 5 through 7 are cross-sectional views and an equivalent circuit diagram illustrating semiconductor devices including conductive plugs according to other example embodiments of the inventive concepts, FIG. 7 being an equivalent circuit diagram illustrating a portion VII of FIG. 5 or 6.
Figure 6:
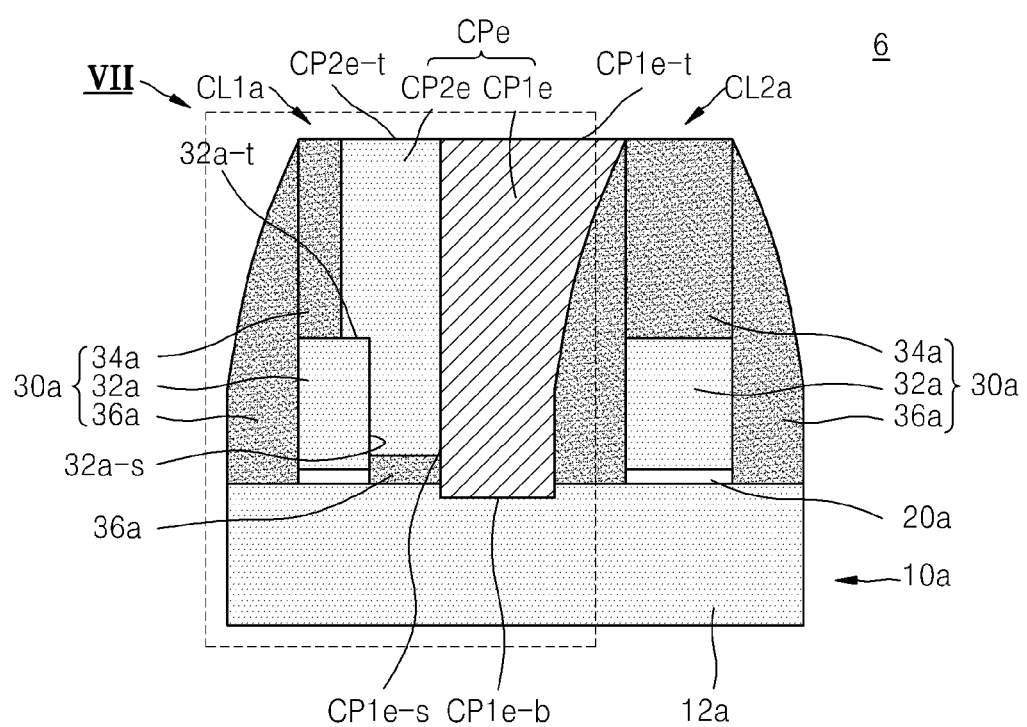
Figure 7:
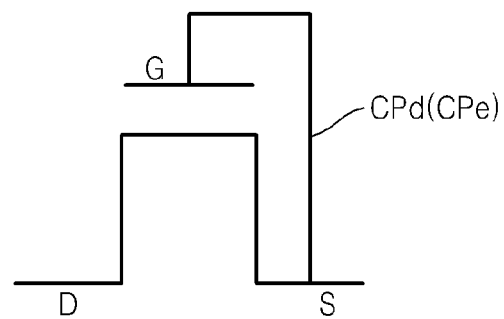

FIGS. 5 through 7 are cross-sectional views and an equivalent circuit diagram illustrating semiconductor devices including conductive plugs, according to other example embodiments of the inventive concepts. In detail, FIG. 7 is an equivalent circuit diagram illustrating a portion VII of FIG. 5 or 6.

Referring to FIG. 5, a semiconductor device 5 includes a conductive line 32a and a conductive plug structure CPd which are formed on a substrate 10a including a target connection region 12a. The conductive plug structure CPd may electrically connect the conductive line 32a to the target connection region 12a. The conductive line 32a may be spaced apart from the substrate 10a with an insulating layer 20a therebetween.

The substrate 10a may include the target connection region 12a. The target connection region 12a may be, for example, an active region. Although not shown in FIG. 5, the substrate 10a may further include a device-isolating region.

The semiconductor device 5 may include a plurality of conductive line structures 30a each including the conductive line 32a. The plurality of conductive line structures 30a may include a first conductive line structure CL1a and a second conductive line structure CL2a. The insulating layer 20a may be formed on the substrate 10a.

Each of the first and second conductive line structures CL1a and CL2a may include the conductive line 32a, a capping layer 34a that is formed on (or, alternatively, over) the conductive line 32a, and a spacer layer 36a that covers both (or, alternatively, at least one) side walls of the conductive line 32a. The first conductive line structure CL1a and the second conductive line structure CL2a may be spaced apart from each other and may extend in the same direction that is parallel to a main surface of the substrate 10a. The conductive line 32a may be, for example, a gate line.

Although the insulating layer 20a is formed only under the conductive line 32a in FIG. 5, the insulating layer 20a may be formed under the conductive line structures 30a, that is, under both the conductive line 32a and the spacer layer 36a. The insulating layer 20a may be, for example, a gate insulating film.

The conductive plug structure CPd may include a first conductive plug CP1d and a second conductive plug CP2d. The first conductive plug CP1d may have a bottom surface CP1d-b that contacts the target connection region 12a of the substrate 10a, and a second side wall CP1d-s that faces a first side wall 32a-s of the conductive line 32a of the first conductive line structure CL1a. The second conductive plug CP2d may be disposed between the conductive line 32a of the first conductive line structure CL1a and the first conductive plug CP1d, and may contact both the first side wall 32a-s of the conductive line 32a and the second side wall CP1d-s of the first conductive plug CP1d.

The first conductive plug CP1d may contact the spacer layer 36a of the second conductive line structure CL2a. That is, the second side wall CP1d-s of the first conductive plug CP1d may contact the second conductive plug CP2d, and a side wall opposite to the second side wall CP1d-s of the first conductive plug CP1d may contact the spacer layer 36a of the second conductive line structure CL2a. The first conductive plug CP1d may extend toward the substrate 10a to be connected to the target connection region 12a.

The second conductive plug CP2d may penetrate the spacer layer 36a of the first conductive line structure CL1a, and may contact the first side wall 32a-s of the conductive line 32a of the first conductive line structure CL1a and also the second side wall CP1d-s of the first conductive plug CP1d. The second conductive plug CP2d may be electrically connected to the target connection region 12a through the first conductive plug CP1d, and the conductive line 32a of the first conductive line structure CL1a may be electrically connected to the target connection region 12a through the second conductive plug CP2d and the first conductive plug CP1d.

The conductive line 32a of the first conductive line structure CL1a may be electrically connected to the target connection region 12a through the second conductive plug CP2d. Also, the conductive line 32a of the first conductive line structure CL1a may be electrically connected to the target connection region 12a through the second conductive plug CP2d and the first conductive plug CP1d that contacts the second conductive plug CP2d.

The target connection region 12a and the conductive line 32a of the first conductive line structure CL1a may be electrically connected to each other through the second conductive plug CP2d and may also be electrically connected to each other through the second conductive plug CP2d and the first conductive plug CP1d.

In detail, the conductive line 32a of the first conductive line structure CL1a may contact the second conductive plug CP2d through the first side wall 32a-s, and the second conductive plug CP2d may contact the target connection region 12a to be electrically connected to the target connection region 12a. The second conductive plug CP2d may contact the first conductive plug CP1d through the second side wall CP1d-s of the first conductive plug CP1d, and the bottom surface CP1d-b of the first conductive plug CP may contact the target connection region 12a to be electrically connected to the target connection region 12a.

Accordingly, contact resistance necessary in order for the semiconductor device 5 to have sufficient reliability may be ensured without being affected by misalignment occurring in a process of forming the second conductive plug CP2d.

FIG. 6 is a cross-sectional view illustrating another example embodiment of the semiconductor device 5 of FIG. 5, and thus a repeated explanation will not be given.

Referring to FIG. 6, a semiconductor device 6 includes the conductive line 32a and a conductive plug structure CPe which are formed on the substrate 10a including the target connection region 12a. The conductive plug structure CPe may include a first conductive plug CP1e and a second conductive plug CP2e.

Unlike the second conductive plug CP2d of FIG. 5, the second conductive plug CP2e of FIG. 6 may not directly contact the target connection region 12a of the substrate 10a. A portion of the spacer layer 36a of the first conductive line structure CL1a may remain and be disposed between the target connection region 12a and a bottom surface of the second conductive plug CP2e.

Even when the second conductive plug CP2e does not directly contact the target connection region 12a of the substrate 10a, the first conductive plug CP1e that is self-aligned with the spacer layer 36a of each of the first conductive line structure CL1a and the second conductive line structure CL2a may ensure a sufficient contact area with the target connection region 12a of the substrate 10a. Because the second conductive plug CP2e contacts a second side wall CP1e-s of the first conductive plug CP1e, contact resistance necessary in order for the semiconductor device 6 to have sufficient reliability may be ensured between the conductive line 32a of the first conductive line structure CL1a and the target connection region 12a of the substrate 10a.

Although top surfaces CP1d-t and CP1e-t of the first conductive plug CP1d and CP1e are on the same level as top surfaces CP2d-t and CP2e-t of the second conductive plugs CP2d and CP2e of FIGS. 5 and 6, the second conductive plugs CP2d and CP2e may contact the top surfaces CP1d-t and CP1e-t of the first conductive plugs CP1d and CP1e, like in FIGS. 1 and 2.

Referring to FIG. 7, the conductive plug structure CPd or CPe of FIG. 5 or 6 may function as a transistor by connecting a gate G and a source S. The gate G of the transistor may correspond to the conductive line 32a of the first conductive line structure CL1a and the source S of the transistor may correspond to the target connection region 12a of the substrate 10a of FIGS. 5 and 6.

The semiconductor devices 5 and 6 of FIGS. 5 and 6 may be any semiconductor devices including diodes using transistors. Examples of the semiconductor devices 5 and 6 of FIGS. 5 and 6 may include central processing units (CPUs), digital signal processors (DSPs), processors obtained by combining CPUs and DSPs, application-specific integrated circuits (ASICs), micro-electro-mechanical system (MEMS) devices, and optoelectronic devices. Also, the semiconductor devices 5 and 6 of FIGS. 5 and 6 may be memory devices such as DRAMs, static random-access memories (SRAMs), or flash memories. In this case, diodes using transistors may be applied to peripheral circuits or core regions.

Figure 8:
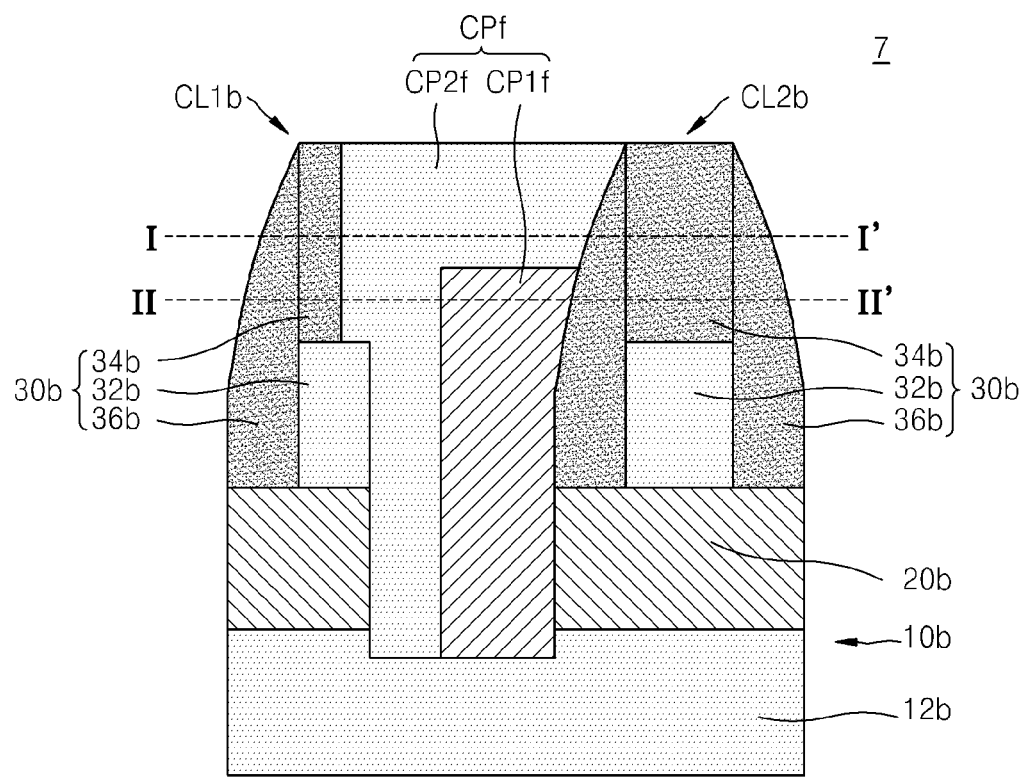
FIGS. 8 and 9 are cross-sectional views illustrating semiconductor devices including conductive plugs according to yet another example embodiment of the inventive concepts.
Figure 9:
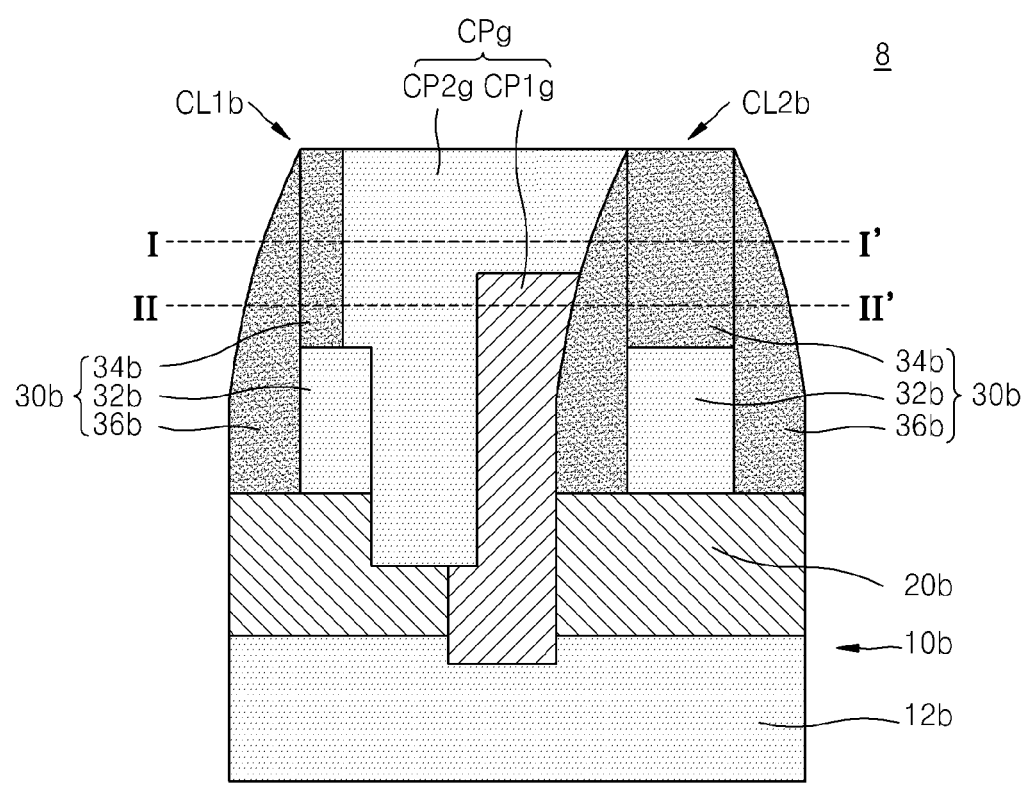

FIGS. 8 and 9 are cross-sectional views illustrating semiconductor devices including conductive plugs, according to yet other example embodiments of the inventive concepts. The semiconductor devices 7 and 8 of FIGS. 8 and 9 have identical or similar shapes to those of the semiconductor devices 1 and 2 of FIGS. 1 and 2 except shapes of a substrate 10b and a target connection region 12b, and thus a repeated explanation thereof will not be given.

Referring to FIGS. 8 and 9, the substrate 10b includes the target connection region 12b. The target connection region 12b may be a wiring line. Also, a conductive line 32b may be a wiring line that is formed over the target connection region 12b. That is, the target connection region 12b and the conductive line 32b may constitute a multi-layer wiring line structure. An insulating layer 20b may be an inter-metal dielectric (IMD) layer. A conductive plug structure CPf may be a via-plug that connects wiring lines.

The semiconductor devices 7 and 8 of FIGS. 8 and 9 may be any semiconductor devices having multi-layer wring line structures including two or more layers. Examples of the semiconductor devices 7 and 8 of FIGS. 8 and 9 may include memory devices such as DRAMs, SRAMs, or flash memories, CPUs, DSPs, processors obtained by combining CPUs and DSPs, ASICs, MEMS devices, and optoelectronic devices.

Although not shown in FIGS. 8 and 9, like in FIGS. 3 and 4, first conductive plugs CP1f and CP1g and second conductive plugs CP2f and CP2g may have top surfaces that are on the same level. Also, an upper portion over a line I-I' or II-II' may be removed in a process of manufacturing the semiconductor devices 7 and 8 of FIGS. 8 and 9.

FIGS. 10 through 26 are plan views and cross-sectional views illustrating methods of manufacturing semiconductor devices including conductive plugs, according to further example embodiments of the inventive concepts.

Portions AA', BB', CC', DD', EE', and FF' of FIGS. 10 through 26 are respectively taken along lines A-A', B-B', C-C', D-D', E-E', and F-F'. Plan views of FIGS. 10 through 26 may not show some elements to easily and efficiently describe an arrangement of elements and may be layouts showing elements of previous steps.

FIGS. 10 through 19 illustrate a method of manufacturing the semiconductor device of FIG. 1, according to an example embodiment of the inventive concepts.

Figure 10:
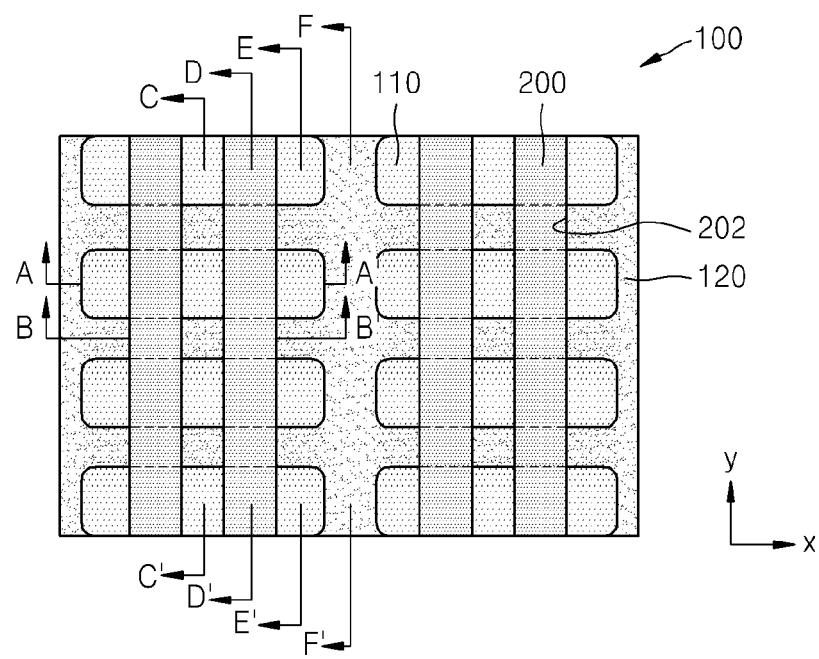
FIGS. 10 through 26 are plan views and cross-sectional views illustrating methods of manufacturing semiconductor devices including conductive plugs, according to an example embodiment of the inventive concepts.
Figure 10:
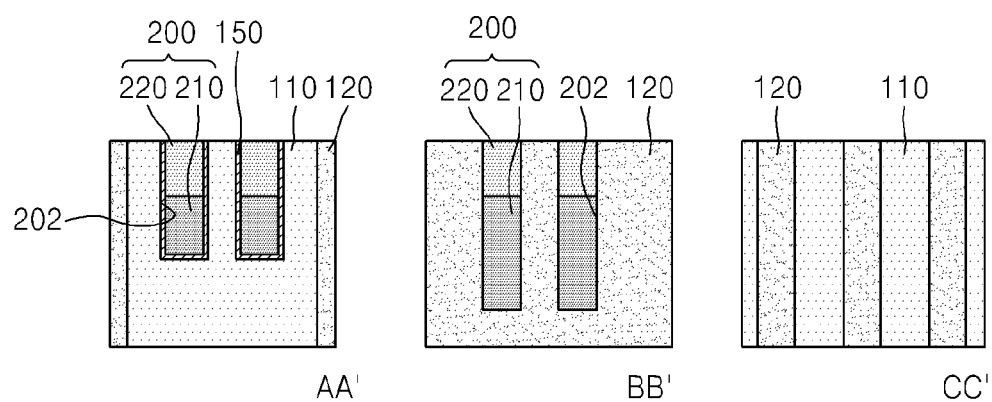
Figure 10:
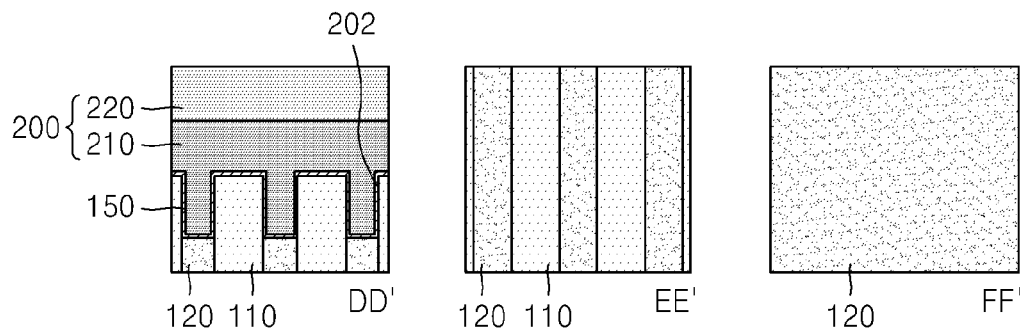

Referring to FIG. 10, a trench is formed in a substrate 100, and then a device-isolating region 120 for filling the trench is formed. A plurality of active regions 110 each corresponding to a target connection region are defined on the substrate 100 by the device-isolating region 120. Each of the plurality of active regions 110 may have relatively a long island shape in a first direction (x direction) having a short axis and a long axis. The plurality of active regions 110 may be arranged in the first direction (x direction) and a second direction.

The substrate 100 may include, for example, crystalline, polycrystalline, or amorphous silicon (Si). The substrate 100 may include a compound semiconductor such as germanium (Ge), silicon germanium (SiGe), silicon carbide (SiC), gallium arsenide (GaAs), indium arsenide (InAs), or indium phosphide (InP). Alternatively, the substrate 100 may have a silicon-on-insulator (SOI) structure or include a buried oxide (BOX) layer. The substrate 100 may include a conductive region, for example, a well doped with impurities or a structure doped with impurities.

The device-isolating region 120 may have a single-layer structure including oxide, nitride, or silicon oxynitride, or a multi-layer structure including a combination thereof.

A plurality of recess regions 202 are formed in the substrate 100. The plurality of recess regions 202 may extend in the second direction (y direction) to be parallel to one another, and may have linear shapes crossing the plurality of active regions 110.

As shown in the portion DD' of FIG. 10, the plurality of recess regions 202 having stepped bottom surfaces may be formed by etching the device-isolating region 120 and the substrate 100 by using different etching processes to make an etched depth of the device-isolating region 120 and an etched depth of the substrate 100 different from each other.

After a resultant structure including the plurality of recess regions 202 is cleaned, a plurality of gate dielectric films 150, a plurality of buried gate lines 210, and a plurality of buried insulating films 220 are sequentially formed in the plurality of recess regions 202. The buried gate lines 210 and the buried insulating films 220 may be collectively referred to as buried gate structures 200. In an example embodiment, after the buried gate lines 210 are formed, source/drain regions (not shown) may be formed on top surfaces of the plurality of active regions 110 by implanting impurity ions into the active regions 110 from both sides of the buried gate lines 210. Alternatively, before the plurality of buried gate lines 210 are formed, a process of implanting impurity ions in order to form the source/drain regions may be performed.

Top surfaces of the plurality of buried gate lines 210 may have lower levels than top surfaces of the active regions 110. Bottom surfaces of the plurality of buried gate lines 210 may have uneven shapes, and a saddle fine type field-effect transistor (FinFET) may be formed on each of the plurality of active regions 110. The plurality of buried gate lines 210 may be formed of at least one material selected from the group consisting of, for example, titanium (Ti), titanium nitride (TiN), tantalum (Ta), tantalum nitride (TaN), tungsten (W), tungsten nitride (WN), titanium silicon nitride (TiSiN), and tungsten silicon nitride (WSiN).

The gate dielectric films 150 may be formed of at least one selected from the group consisting of silicon oxide, silicon nitride, silicon oxynitride, oxide/nitride/oxide (ONO), and a high-k dielectric film having a dielectric constant higher than that of silicon oxide. For example, the gate dielectric films 150 may have a dielectric constant of about 10 to 25. The gate dielectric films 150 may be formed of at least one material selected from the group consisting of, for example, hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric films 150 may be formed of $HfO_2$, $Al_2O_3$, $HfAlO_3$, $Ta_2O_3$, or $TiO_2$.

Top surfaces of the plurality of buried insulating films 220 may be almost on the same level as the top surfaces of the active regions 110. The buried insulating films 220 may be formed of silicon oxide, silicon nitride, silicon oxynitride, or a combination thereof.

Figure 11:
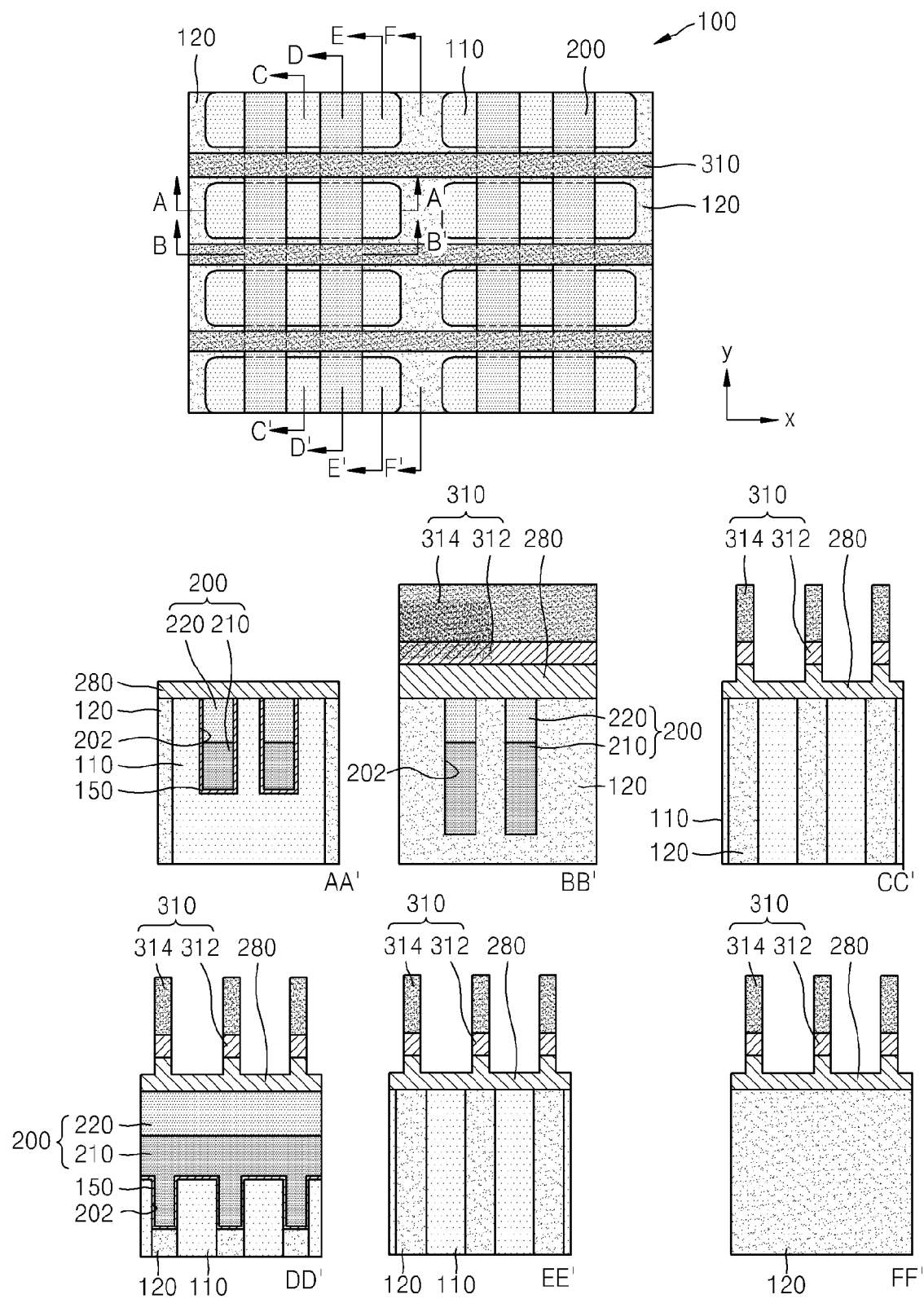

Referring to FIG. 11, an interlayer insulating film pattern 280 may be formed on the substrate 100. The interlayer insulating film pattern 280 may have a thickness of about 200 to 400 Å. The interlayer insulating film pattern 280 may include silicon oxide. For example, the interlayer insulating film pattern 280 may be formed of tetraethylorthosilicate (TEOS), high density plasma (HDP), or boro-phospho silicate glass (BPSG).

The interlayer insulating film pattern 280 may further include a material other than silicon oxide. The interlayer insulating film pattern 280 may further include, for example, polycrystalline silicon. Even when the interlayer insulating film pattern 280 includes polycrystalline silicon, since the polycrystalline silicon is surrounded by a remaining portion of the interlayer insulating film pattern 280, the interlayer insulating film pattern 280 may function as an insulating film overall.

A plurality of bit line stacked structures 310 that extend to be parallel to one another are formed on the interlayer insulating film pattern 280. The plurality of bit line stacked structures 310 may include a plurality of bit lines 312, and a plurality of capping layers 314 that over top surfaces of the plurality of bit lines 312. In an alternative embodiment, the line stacked structures may be word line stacked structures.

The plurality of bit lines 312 may extend in a direction that is parallel to a main surface of the substrate 100. The plurality of bit lines 312 may be formed of at least one material selected from the group consisting of, for example, a semiconductor doped with impurities, a metal, a conductive metal nitride, and metal silicide. For example, the plurality of bit lines 312 may have a stacked structure in which doped polysilicon, tungsten nitride, and tungsten are sequentially stacked.

The plurality of capping layers 314 may be formed of, for example, silicon nitride. Thicknesses of the plurality of capping layers 314 may be greater than thicknesses of the plurality of bit lines 312.

In an example embodiment, in order to form the plurality of bit line stacked structures 310, a bit line forming conductive layer, and a capping layer forming insulating layer that covers the bit line forming conductive layer are formed on the interlayer insulating film pattern 280. A thickness of the capping layer forming insulating layer may be greater than a thickness of the bit line forming conductive layer. The plurality of capping layers 314 may be formed by patterning the capping layer forming insulating layer, and then the plurality of bit lines 312 may be formed by etching the bit line forming conductive layer by using the plurality of capping layers 314 as an etching mask. A stepped portion may be formed on a top surface of the interlayer insulating film pattern 280 by etching a portion of the interlayer insulating film pattern 280 by excessively etching the bit line forming conductive layer.

The bit line forming conductive layer may have, for example, a multi-layer structure. The bit line forming conductive layer may have a multi-layer structure in which, for example, a first metal silicide film, a conductive barrier film, a second metal silicide film, and an electrode layer formed of a metal or a conductive metal nitride are sequentially stacked.

A space having a linear shape may be formed between the plurality of bit line stacked structures 310.

Figure 12:
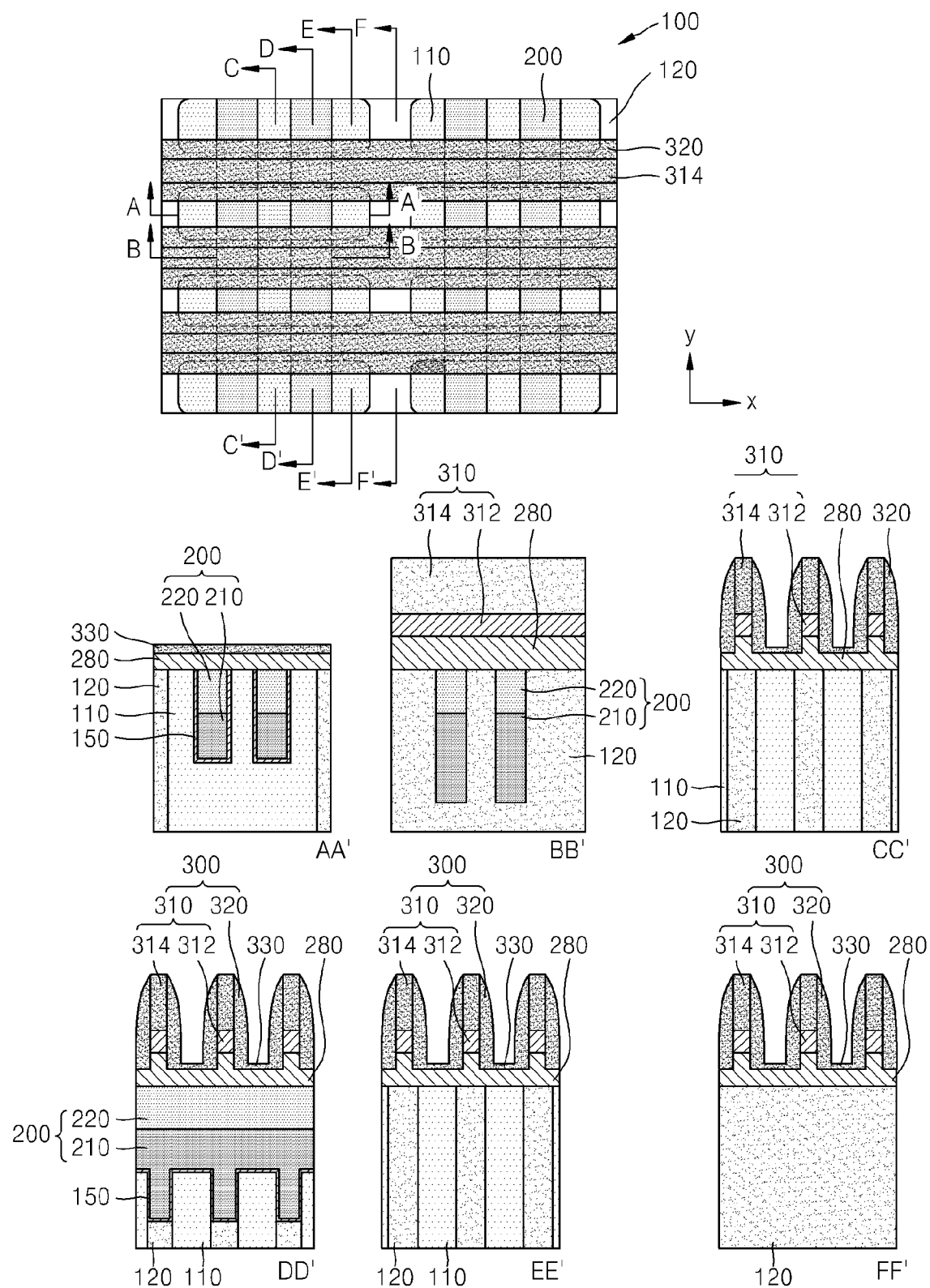

Referring to FIG. 12, a spacer layer 320 that covers both side walls of each of the plurality of bit lines 312 is formed. The spacer layer 320 may cover both side walls of the capping layer 314 and the bit line 312. The bit line 312, the capping layer 314, and the spacer layer 320 may constitute a conductive line structure, that is, a bit line structure 300.

The spacer layer 320 may be formed by forming a spacer material layer to a uniform thickness on top surfaces and both side surfaces of the capping layer 314 and the bit line 312 and then etching the spacer material layer by using etch-back. The spacer layer 320 may be formed to have a spacer structure that covers the both side walls of the bit line 312 and the capping layer 314. The spacer layer 320 may be formed of, for example, oxide, nitride, silicon oxynitride, or a combination thereof.

An insulating liner layer 330 that covers a surface of the interlayer insulating film pattern 280 which is selectively exposed may be further formed. The insulating liner layer 330 may be formed of, for example, oxide, nitride, silicon oxynitride, or a combination thereof. The insulating liner layer 330 may be formed by forming the spacer layer 320 and then covering exposed surfaces of the conductive line structure 300 and the interlayer insulating film pattern 280. Alternatively, the insulating liner layer 330 may be a portion of the spacer material layer that remains on the interlayer insulating film pattern 280 in a process of performing etch-back to form the spacer layer 320.

As described above, FIG. 12 is a layout in which the interlayer insulating film pattern 280 and the insulating liner layer 330 are not shown.

Figure 13:
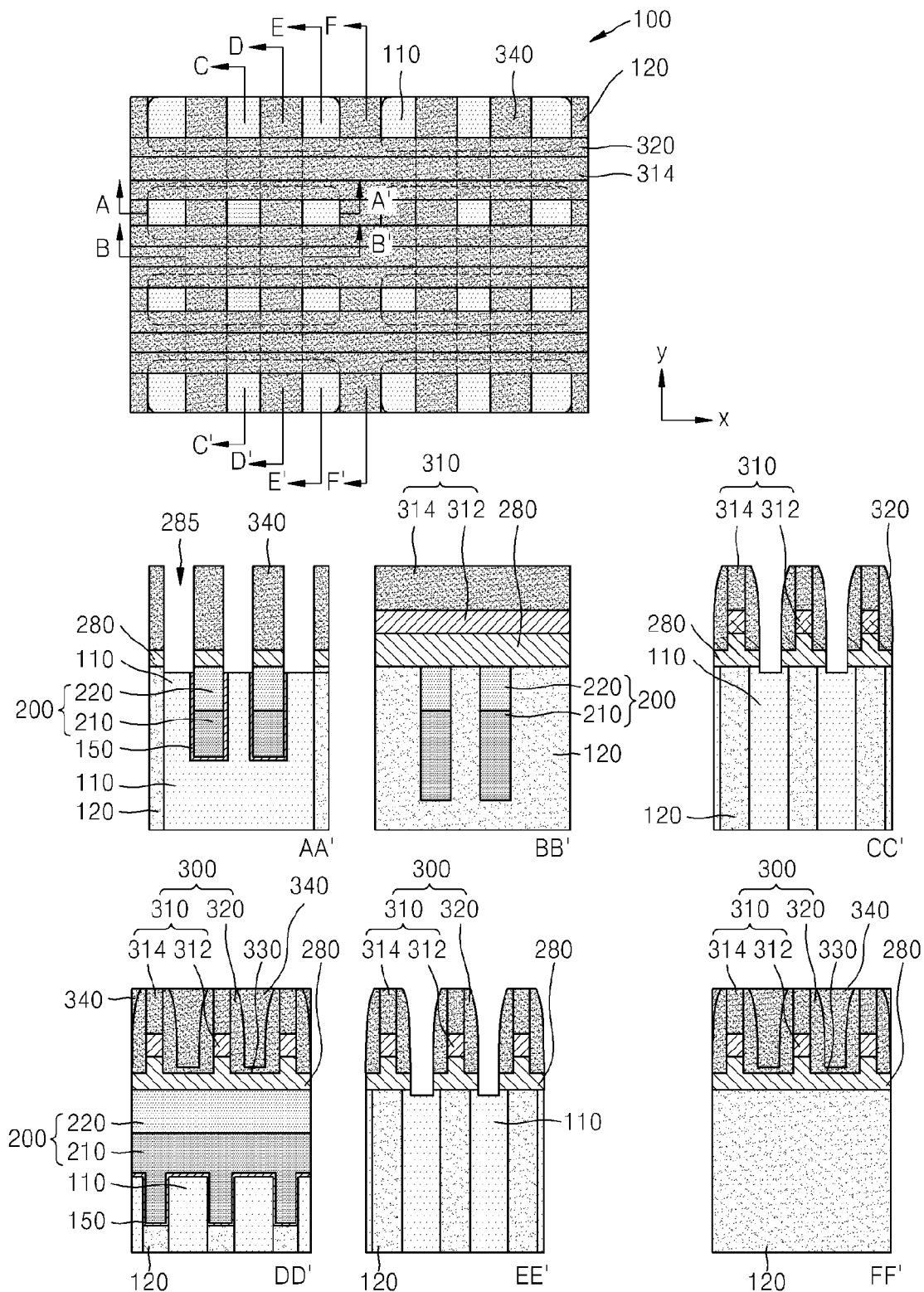

Referring to FIG. 13, a surround insulating film pattern 340 is formed, and then the active region 110 is exposed by removing a portion of the interlayer insulating film pattern 280 by using the spacer layer 320 and the surround insulating film pattern 340 as an etching mask. That is, a portion of the active region 110 may be exposed through a first hole 285 surrounded by the capping layer 314, the spacer layer 320, and the surround insulating film pattern 340. In a process of forming the first hole 285, a portion of the active region 110 may be removed to be recessed from a top surface of the active region 110. The surround insulating film pattern 340 may be formed of a material identical or similar etching characteristics to those of the capping layer 314 and/or the spacer layer 320. The surround insulating film pattern 340 may be formed of, for example, nitride.

In order to form the surround insulating film pattern 340, a buffer mask pattern (not shown) that extends in the second direction (y direction) may be formed on the substrate 100. The buffer mask pattern may be formed such that a space that extends in the second direction (y direction) (along, for example, the line D-D' or F-F') is formed may be disposed along a place where the surround insulating film pattern 340, and a line pattern that extends in the second direction (along, for example, the line C-C' or E-E') is not formed may be disposed along a place where the surround insulating film pattern 340. The buffer mask pattern may be formed of a material having an etch selectivity, for example, oxide, different from that of each of the capping layer 314 and the spacer layer 320.

Next, a surround insulating material layer that fills a spacer between portions of the buffer mask pattern may be formed to cover the substrate 100, a portion of the surround insulating material layer may be removed until the capping layer 314 and the spacer layer 320 are exposed, and then the surround insulating film pattern 340 may be formed by removing a remaining portion of the buffer mask pattern. Chemical mechanical polishing (CMP) may be performed to remove a portion of the surround insulating material layer to form the surround insulating film pattern 340. Upper portions of the capping layer 314 and the spacer layer 320 may also be removed in this process.

Figure 14:
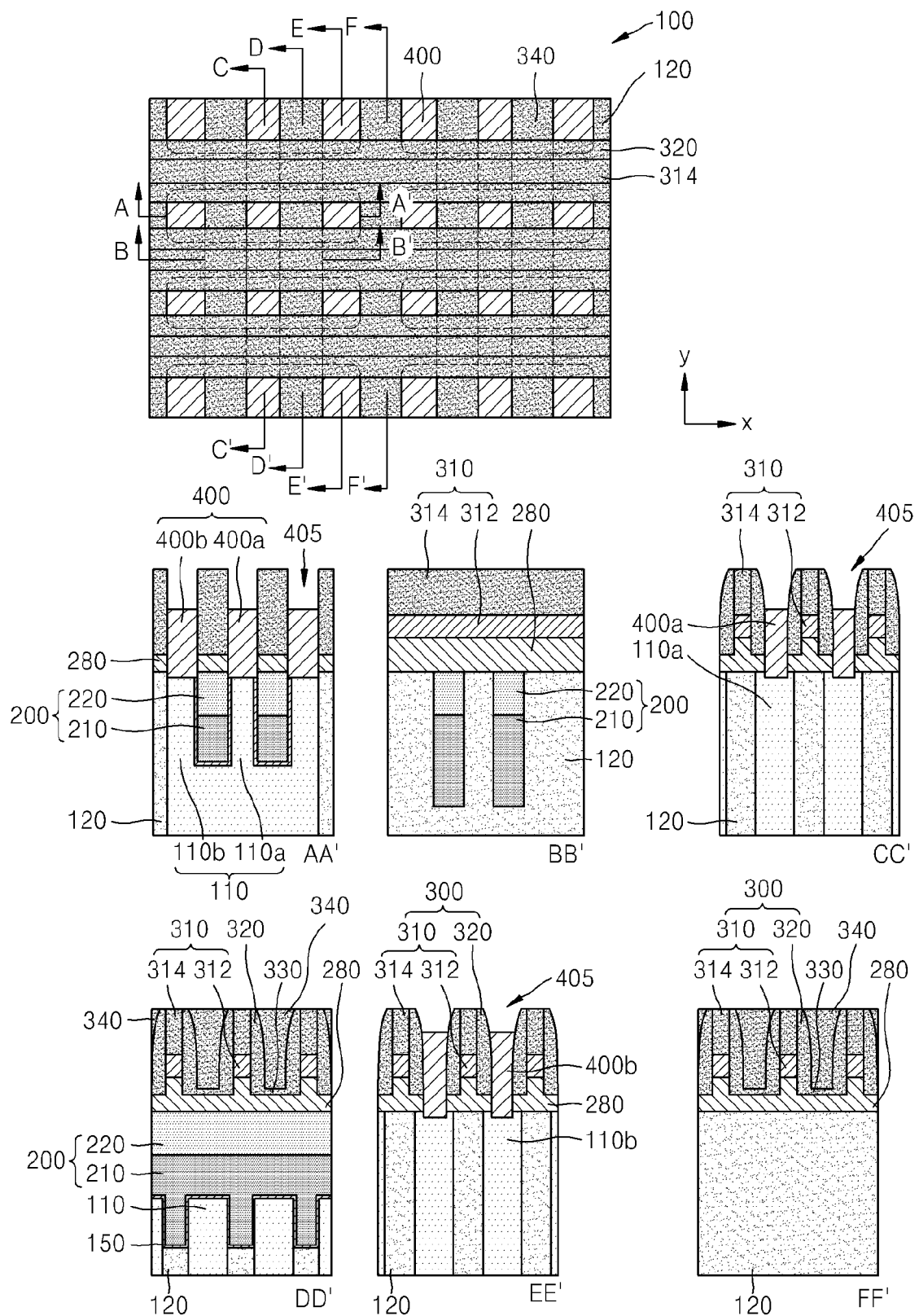

Referring to FIGS. 13 and 14, a conductive plug 400 that fills the first hole 285 is formed. The conductive plug 400 may be formed to fill only a lower portion of the first hole 285, and an upper portion of the first hole 285 not filled with the conductive plug 400 may be recessed from top surfaces of the capping layer 314, the spacer layer 320, and the surround insulating film pattern 340 and may remain as a second hole 405 through which the conductive plug 400 is exposed.

The conductive plug 400 may be formed by forming a first plug material layer that covers the substrate 100 to fill the entire first hole 285 and then performing etch-back. The conductive plug 400 may be formed of at least one material selected from the group consisting of a metal such as Ti, Ta, W, a conductive metal nitride such as TiN, TaN, WN, TiSiN, or WSiN, and doped polysilicon.

The active region 110 may include a first connection region 110a and a second connection region 110b which are spaced apart from each other by the buried gate line 210. A portion of the conductive plug 400 contacting the first connection region 110a may be referred to as a first conductive plug 400a. A portion 400b of the conductive plug 400 contacting the second connection region 110b will be explained below.

Figure 15:
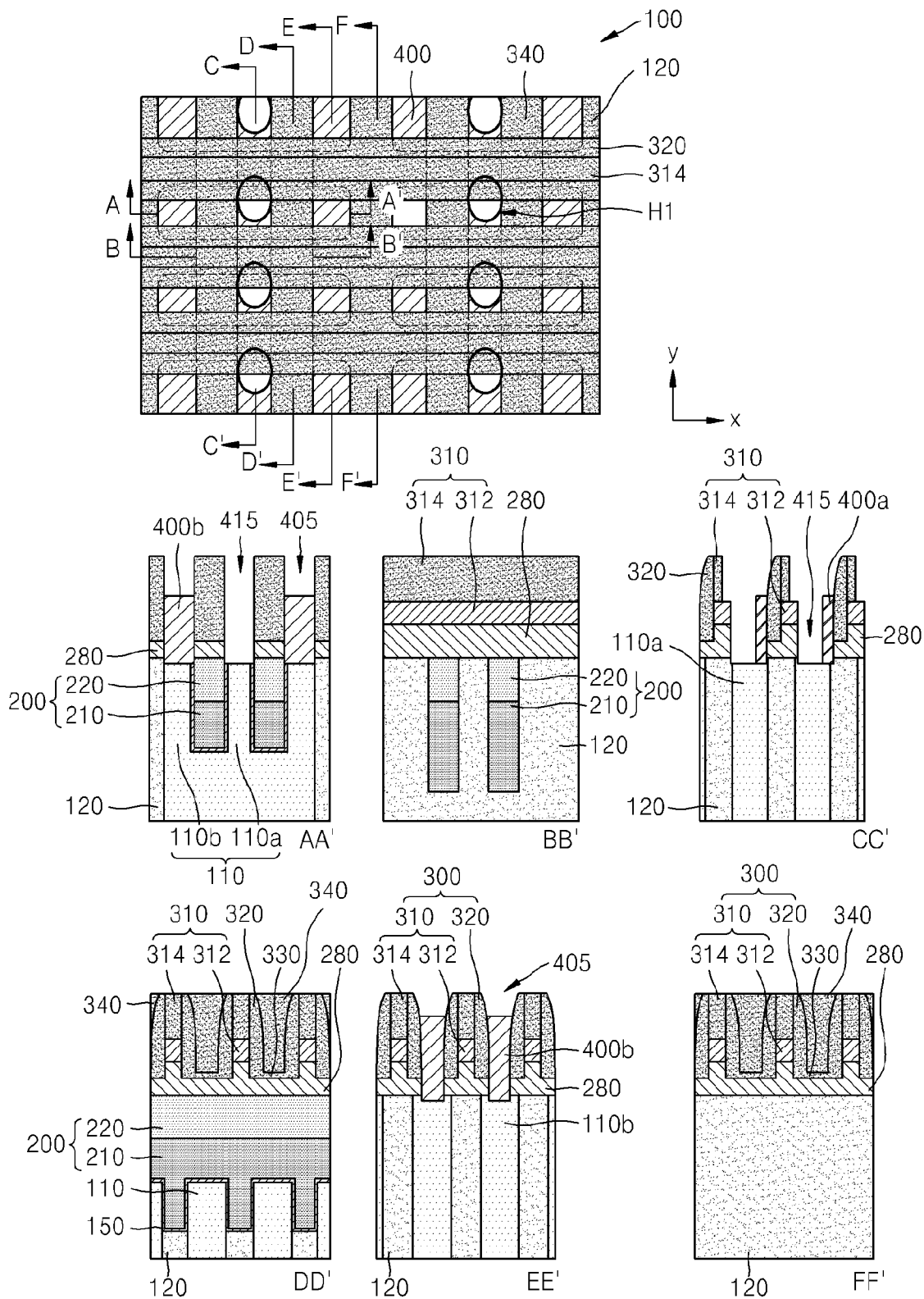

Referring to FIGS. 14 and 15, a mask layer (not shown) through which a first region H1 shown in FIG. 15 is formed, a third hole 415 through which the active region 110 is exposed is formed in the first region H1 by removing portions of the first conductive plug 400a, the capping layer 314, the spacer layer 320, and the interlayer insulating film pattern 280, and then the mask layer is removed. In a process of forming the third hole 415, a portion of the active region 110 may be removed to be recessed from a top surface of the active region 110.

The third hole 415 may expose a portion of the bit line 312 along with the active region 110. A side wall of the bit line 312 and a side wall of the first conductive plug 400a may be exposed through the third hole 415. A portion of a top surface of the bit line 312 may also be exposed through the third hole 415.

Figure 16:
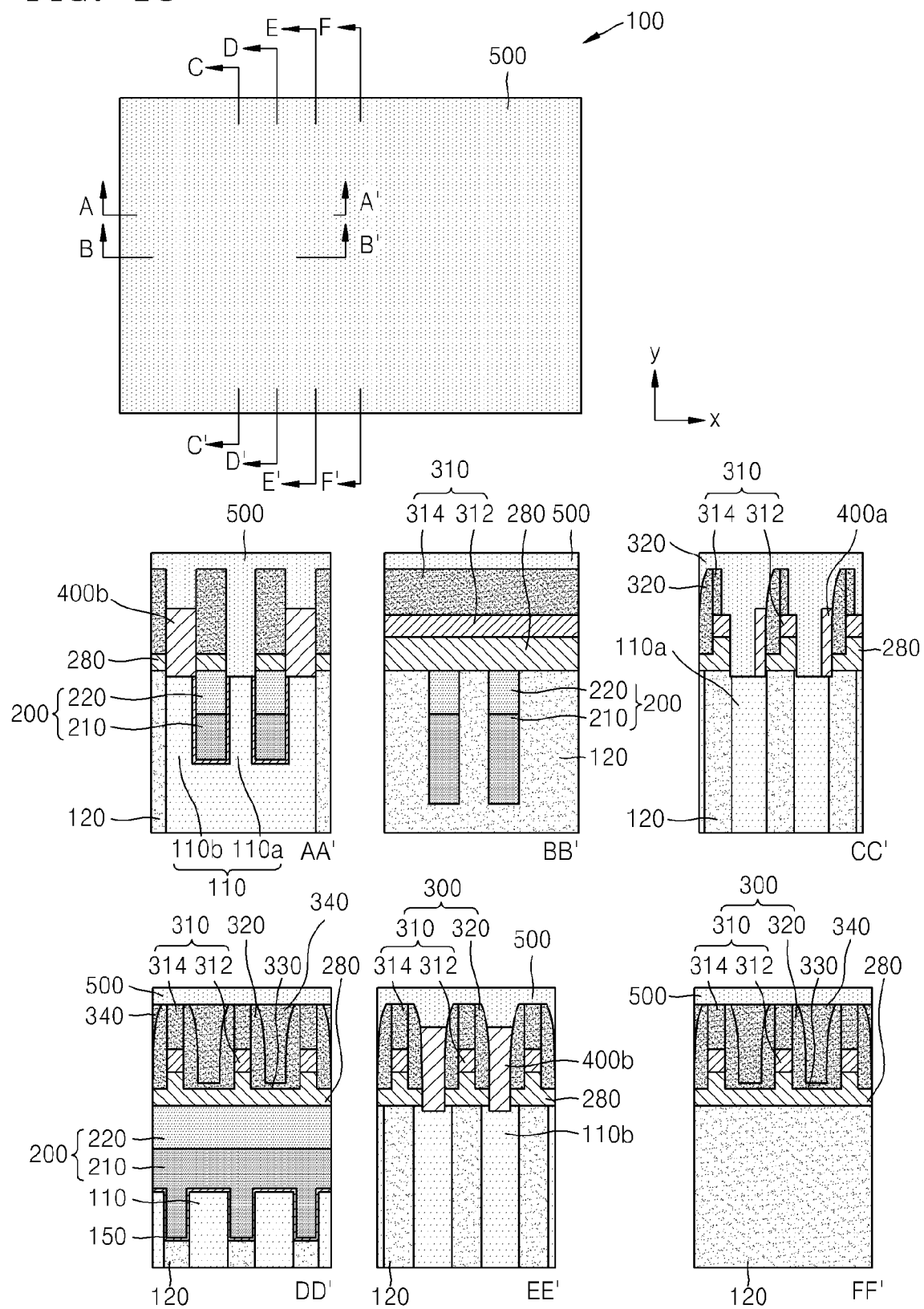

Referring to FIGS. 15 and 16, a second plug material layer 500 that fills both the second hole 405 and the third hole 415 and covers the substrate 100 is formed. The second plug material layer 500 may be formed of at least one material selected from the group consisting of, for example, a metal such as Ti, Ta, or W and a conductive metal nitride such as TiN, TaN, WN, TiSiN, or WSiN.

Figure 17:
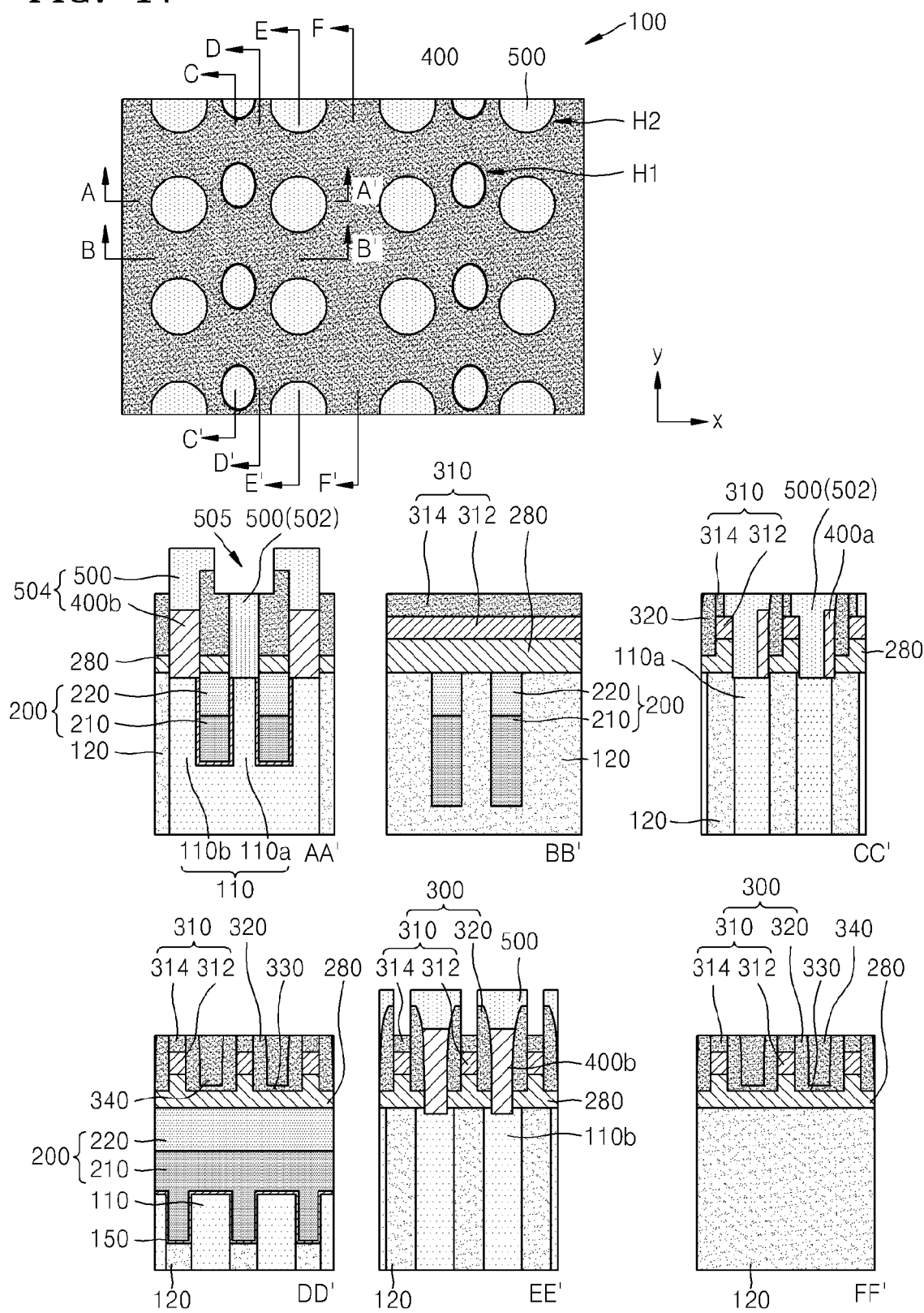

Referring to FIGS. 16 and 17, a mask layer (not shown) through which partially covers a second region H2 shown in FIG. 17 is formed, and then the second plug material 500 is formed by remaining only on the first region H1 and the second region H2 by removing portions of the capping layer 314/the spacer layer 320/the surround insulating film pattern 340 and the second plug material layer 500. A portion of the second plug material layer 500 remaining on the first region H1 may be referred to as a second conductive plug 502. A portion of the second plug material layer 500 remaining on the second region H2 and the portion 400b of the conductive plug 400 disposed under the second plug material layer 500 may be referred to as a third conductive plug 504.

That is, the third conductive plug 504 may contact a second connection region 100b. In particular, the portion 400b of the conductive plug 400 in the third conductive plug 504 may contact the second connection region 100b.

When comparing FIGS. 1 and 17, the conductive line 32, the first conductive plug CP1, and the second conductive plug CP2 may respectively correspond to the bit line 312, the first conductive plug 400a, and the second conductive plug 502.

When comparing FIGS. 11 and 17, the active region 110 corresponding to each target connection region may be formed such that a plurality of the active regions 110 are aligned on the substrate 100 in a direction, that is, the first direction (x direction), in which the bit line 312 extends. Also, the active region 110 may be formed such that a plurality of the active regions 110 is aligned on the substrate 100 in a direction different from the direction in which the bit line 312 extends. For example, a plurality of the active regions 110 may be aligned on the substrate 100 in a direction, that is, the second direction (y direction), in which the buried gate line 210 extends. Also, the first and second conductive plugs 400a and 502 may be formed such that a plurality of the first and second conductive plugs 400a and 502 are aligned to correspond to the plurality of active regions 110 in a direction, that is, the second direction (y direction), different from the direction, that is, the first direction (x direction), in which the bit line 312 extends.

Figure 18:
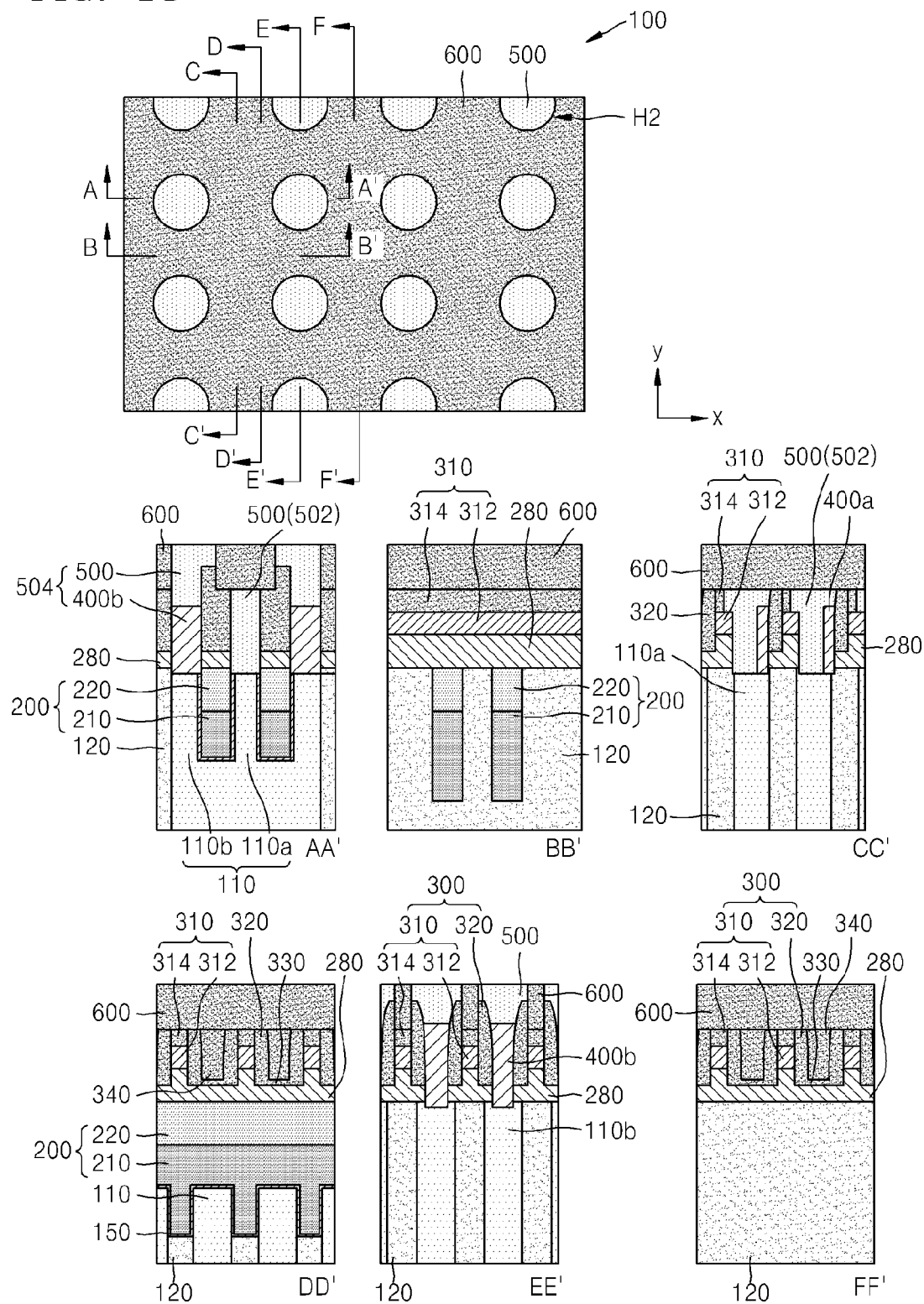

Referring to FIG. 18, a cover insulating layer 600 is formed to cover the second conductive plug 502 and expose the third conductive plug 504. Accordingly, the second plug material layer 500 which is a portion of the third conductive plug 504 may be exposed only on the second region H2. The cover insulating layer 600 may be formed of, for example, oxide, nitride, silicon oxynitride, or a combination thereof.

Figure 19:
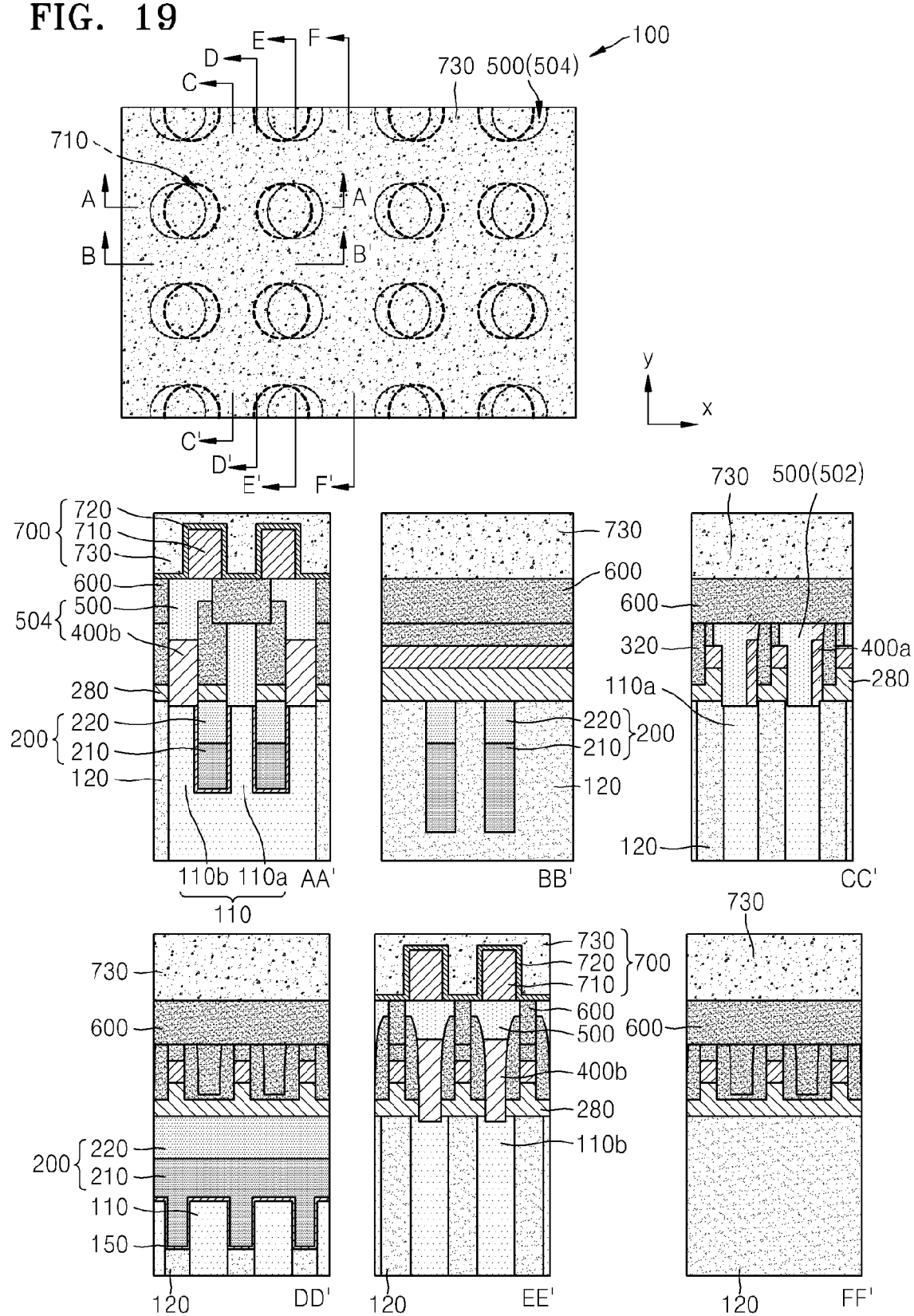

Referring to FIG. 19, a capacitor structure 700 is formed on the third conductive plug 504 to be connected to the third conductive plug 504. The capacitor structure 700 may include a lower electrode layer 710, a capacitor dielectric film 720, and an upper electrode layer 730. A shape of the capacitor structure 700 and materials of the lower electrode layer 710, the capacitor dielectric film 720, and the upper electrode layer 730 are not limited as long as the lower electrode layer 710 may be electrically connected to the third conductive plug 504 and may function as a capacitor for storing charges along with the capacitor dielectric film 720 and the upper electrode layer 730.

Figure 20:
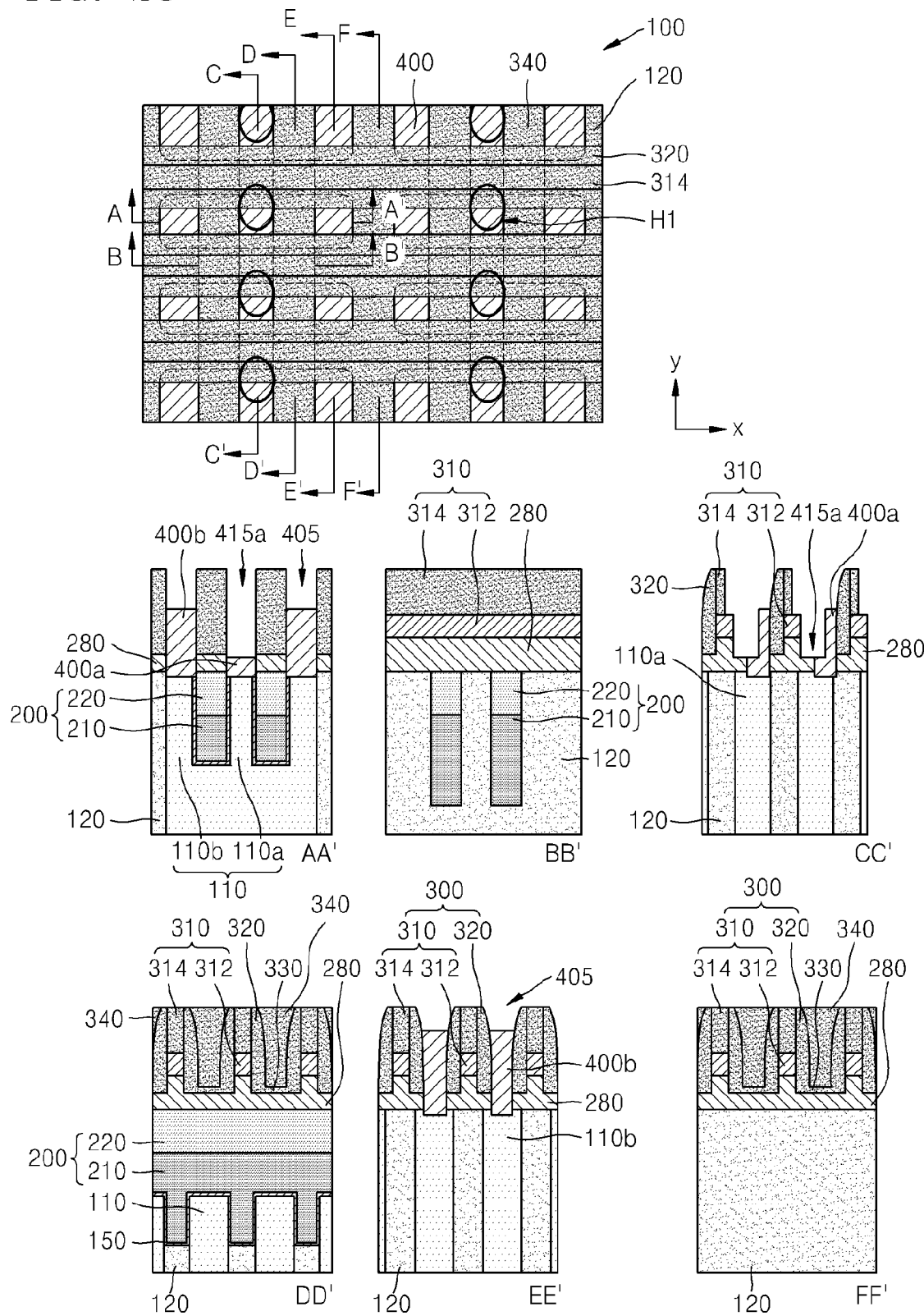

FIG. 20 illustrates a method of manufacturing a semiconductor device including a conductive plug, according to another example embodiment of the inventive concepts. In detail, the method of FIG. 20 is similar to the method of manufacturing a semiconductor device including a conductive plug of FIGS. 10 through 19 except FIG. 15, and thus the following explanation will focus on a difference from FIG. 15.

Referring to FIG. 20, a mask layer (not shown) through which the first region H1 shown in FIG. 20 is exposed is formed, and then portions of the first conductive plug 400a, the capping layer 314, the spacer layer 320, and the interlayer insulating film pattern 280 are removed. In this case, unlike in FIG. 15, portions of the first conductive plug 400a and the interlayer insulating film pattern 280 remain under a third hole 415a formed in the first region H1 in order not to expose the active region 110 on the first region H1. Next, a semiconductor device including a conductive plug may be manufactured by using the method of FIGS. 16 through 19.

Figure 21:
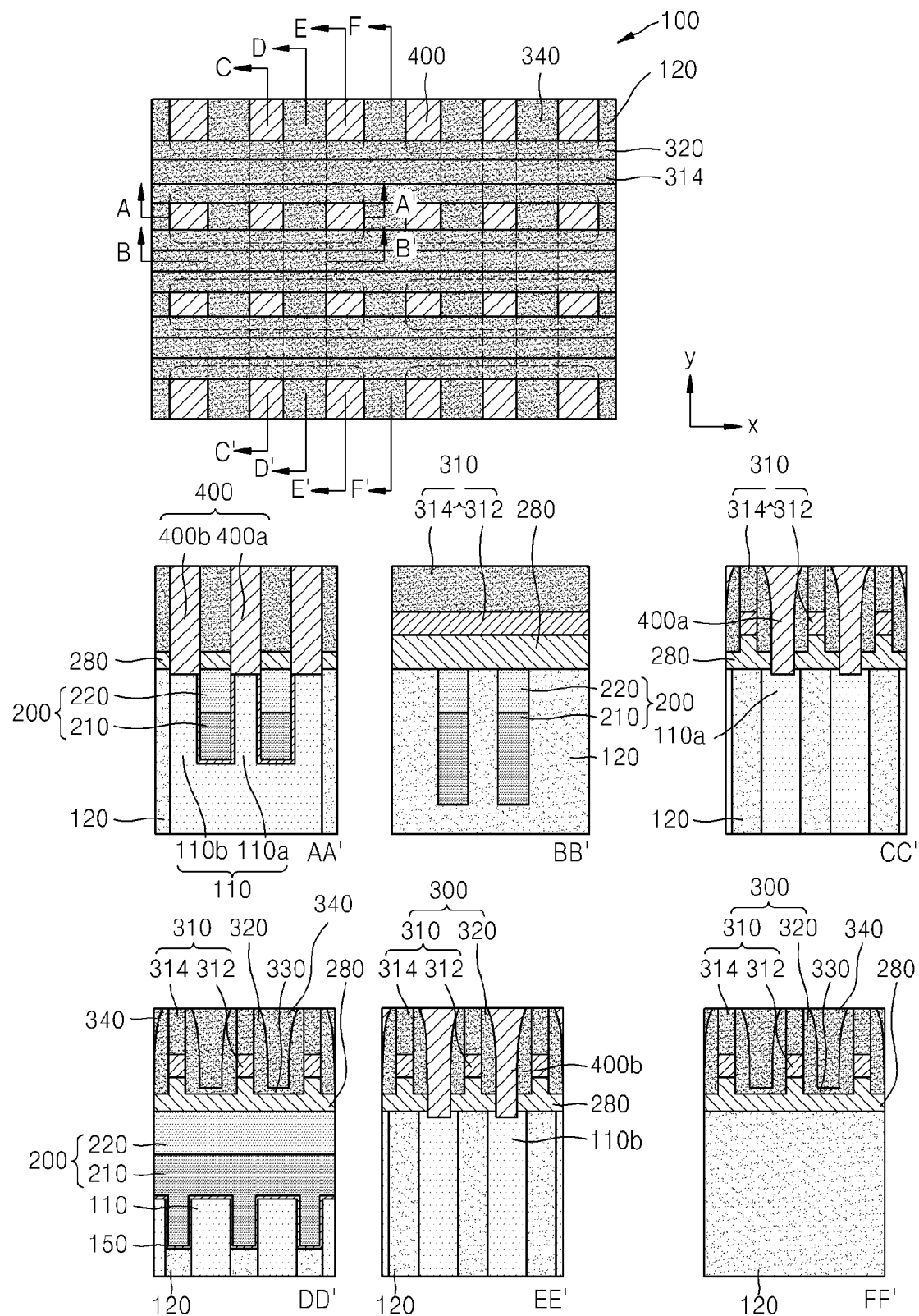
Figure 22:
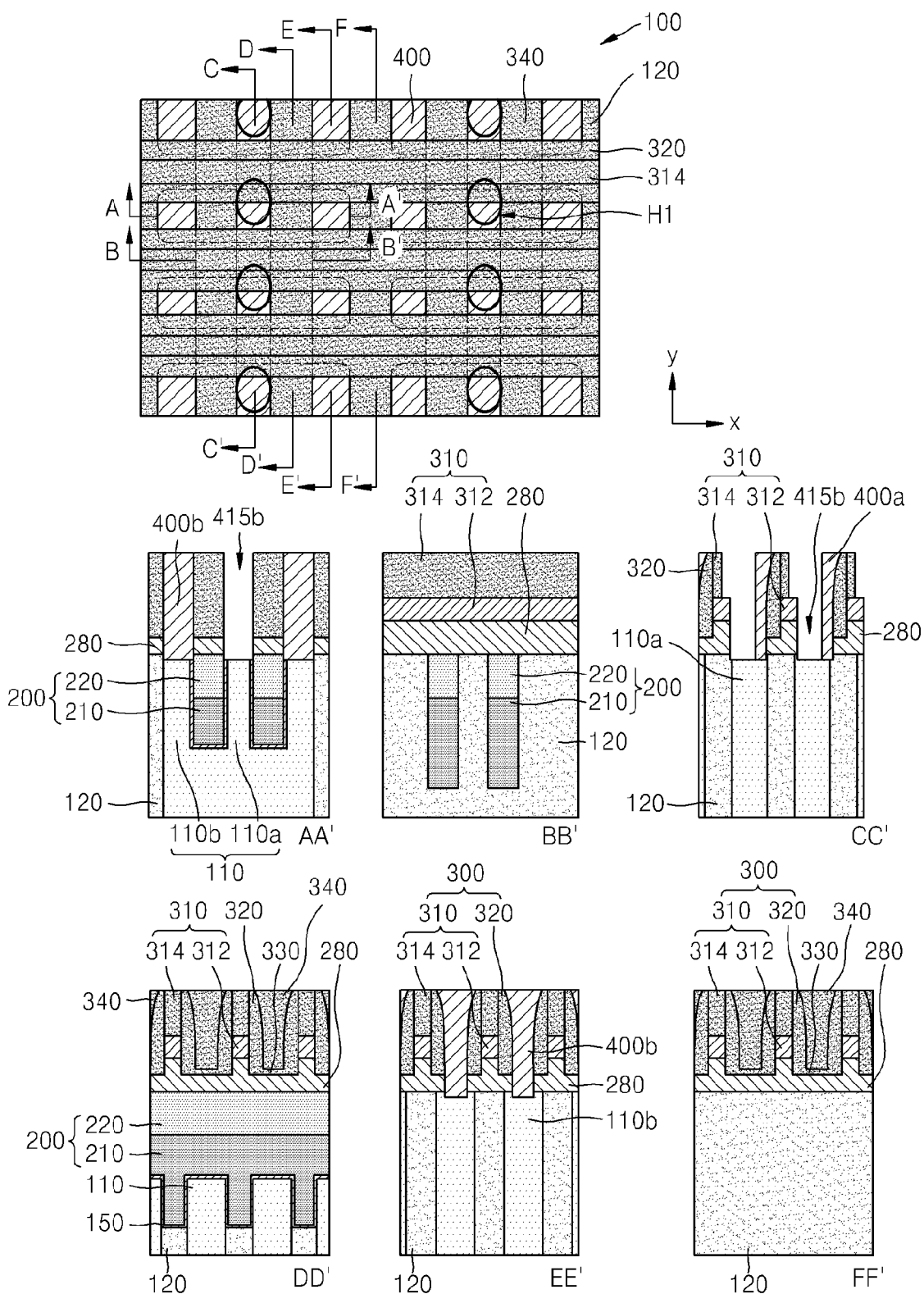

FIGS. 21 and 22 illustrate a method of manufacturing the semiconductor device of FIG. 3, according to yet another example embodiment of the inventive concepts.

In detail, the method of FIGS. 21 and 22 is almost the same as the method of manufacturing a semiconductor device including a conductive plug of FIGS. 10 through 19 except FIGS. 14 and 15, and thus the following explanation will focus on a difference from FIGS. 14 and 15.

Referring to FIGS. 13 and 21, the conductive plug 400 that fills the first hole 285 is formed. The conductive plug 400 may be formed to fill the entire first hole 285.

Referring to FIGS. 21 and 22, a mask layer (not shown) through which the first region H1 shown in FIG. 22 is exposed is formed, a third hole 415b through which the active region 110 is exposed on the first region H1 is formed by removing portions of the capping layer 314, the spacer layer 320, and the interlayer insulating film pattern 280, and then the mask layer is removed.

Next, a semiconductor device including a conductive plug may be manufactured by using the method of FIGS. 16 through 19.

Figure 23:
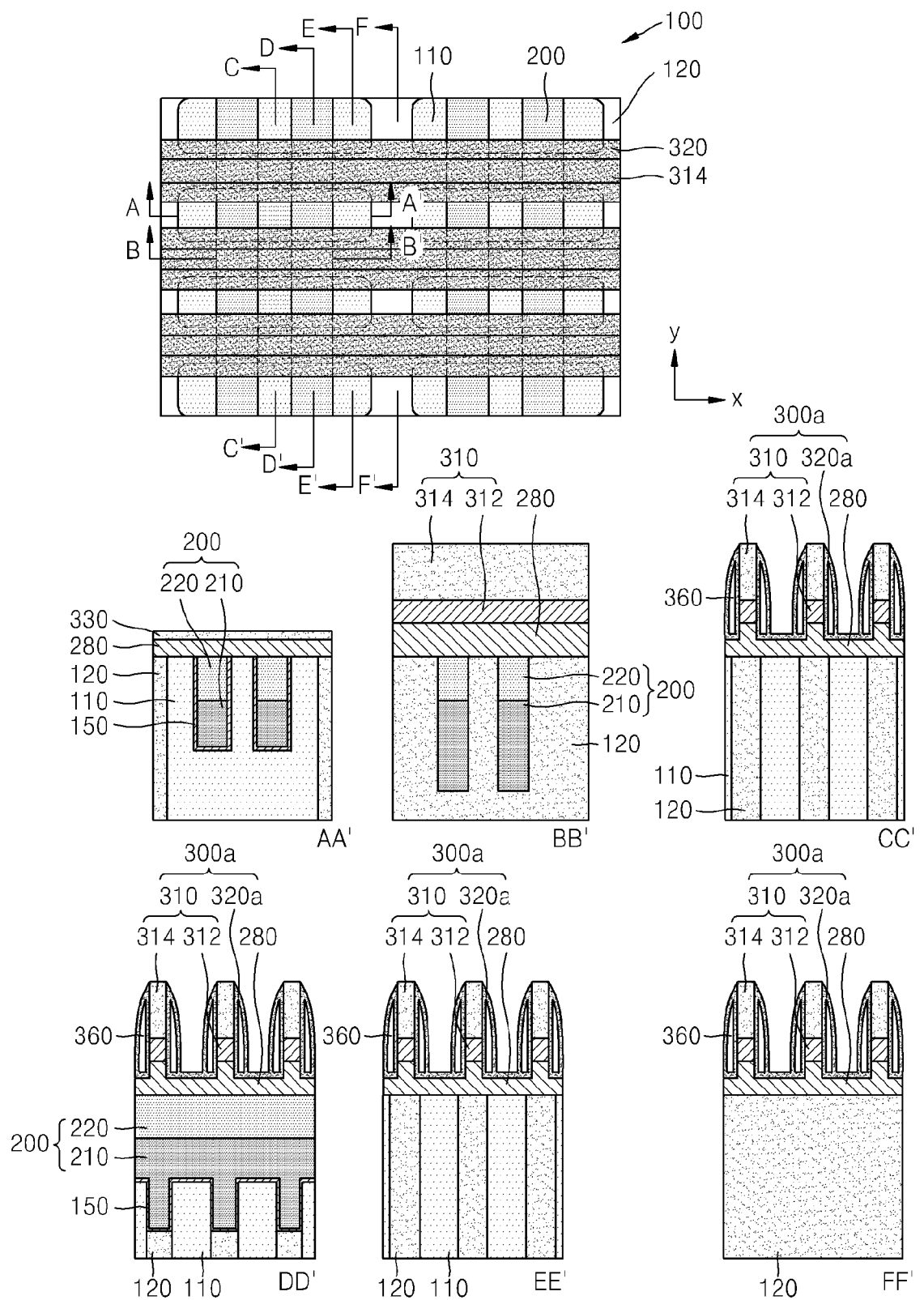

FIG. 23 illustrates a method of manufacturing the semiconductor device of FIG. 4, according to still another example embodiment of the inventive concepts. In detail, the method of FIG. 23 is almost the same as the method of manufacturing a semiconductor device including a conductive plug of FIGS. 10 through 13, FIG. 21, FIG. 22, and FIGS. 16 through 19 except FIG. 22, and thus the following explanation will focus on a difference from FIG. 22.

Referring to FIG. 23, a mask layer (not shown) through which the first region H1 shown in FIG. 22 is exposed is formed, and then portions of the first conductive plug 400a, the capping layer 314, the spacer layer 320, and the interlayer insulating film pattern 280 are removed. In this case, portions of the first conductive plug 400a and the interlayer insulating film pattern 280 remain under a third hole 415c formed in the first region H1 in order not to expose the active region 110 on the first region H1, unlike in FIG. 22. Next, a semiconductor device including a conductive plug may be manufactured by using the method of FIGS. 16 through 19.

Figure 24:
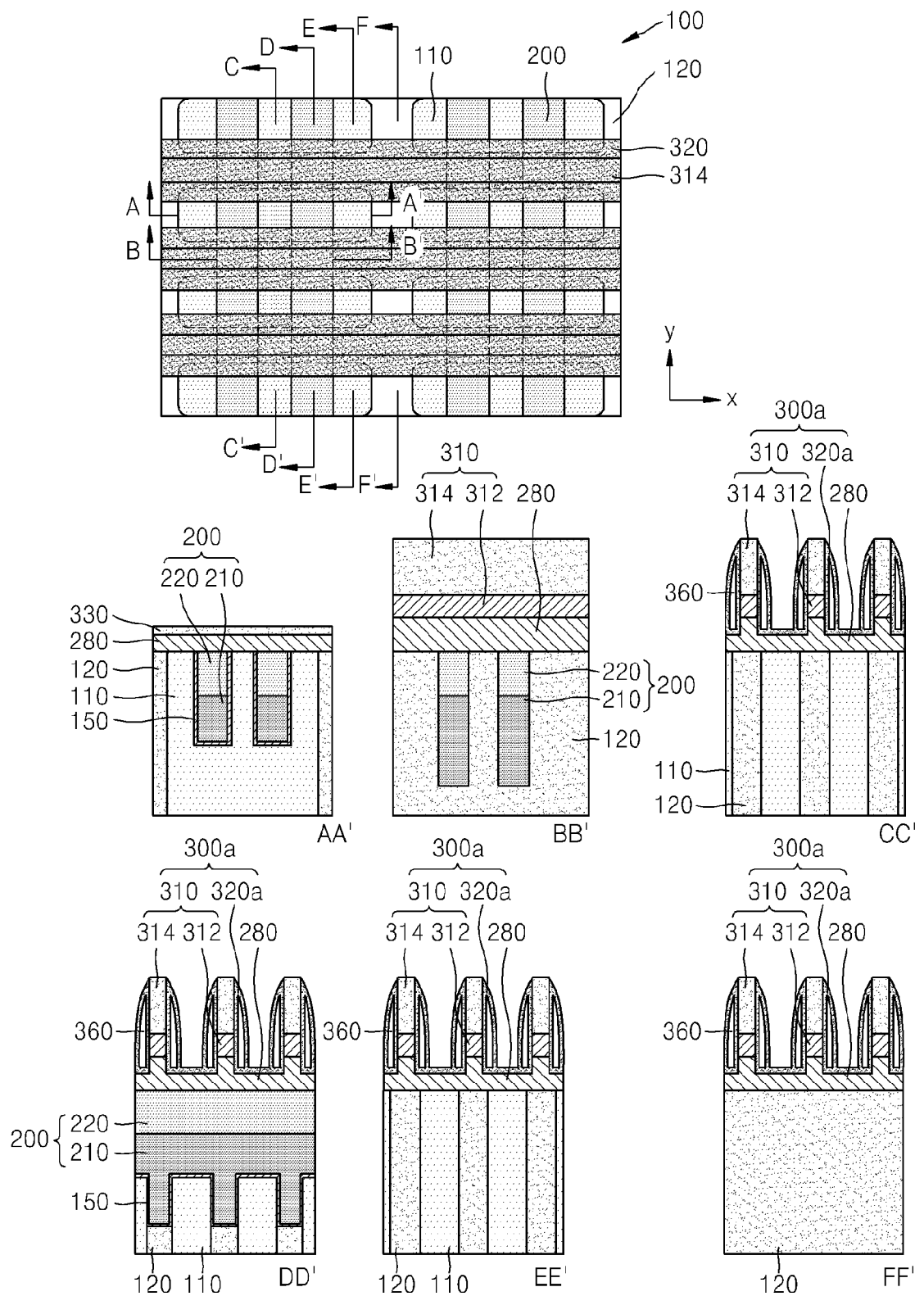
Figure 25:
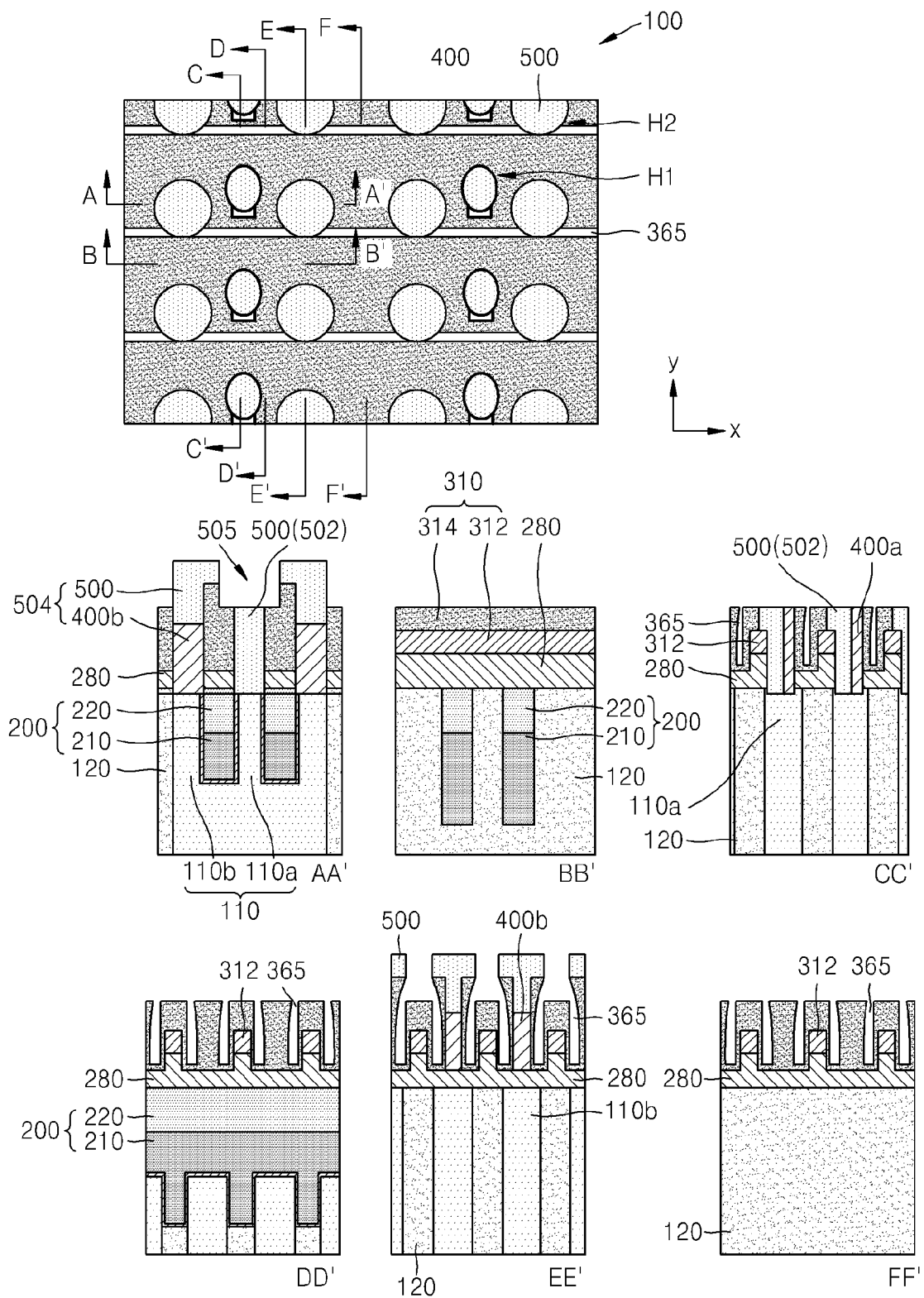
Figure 26:
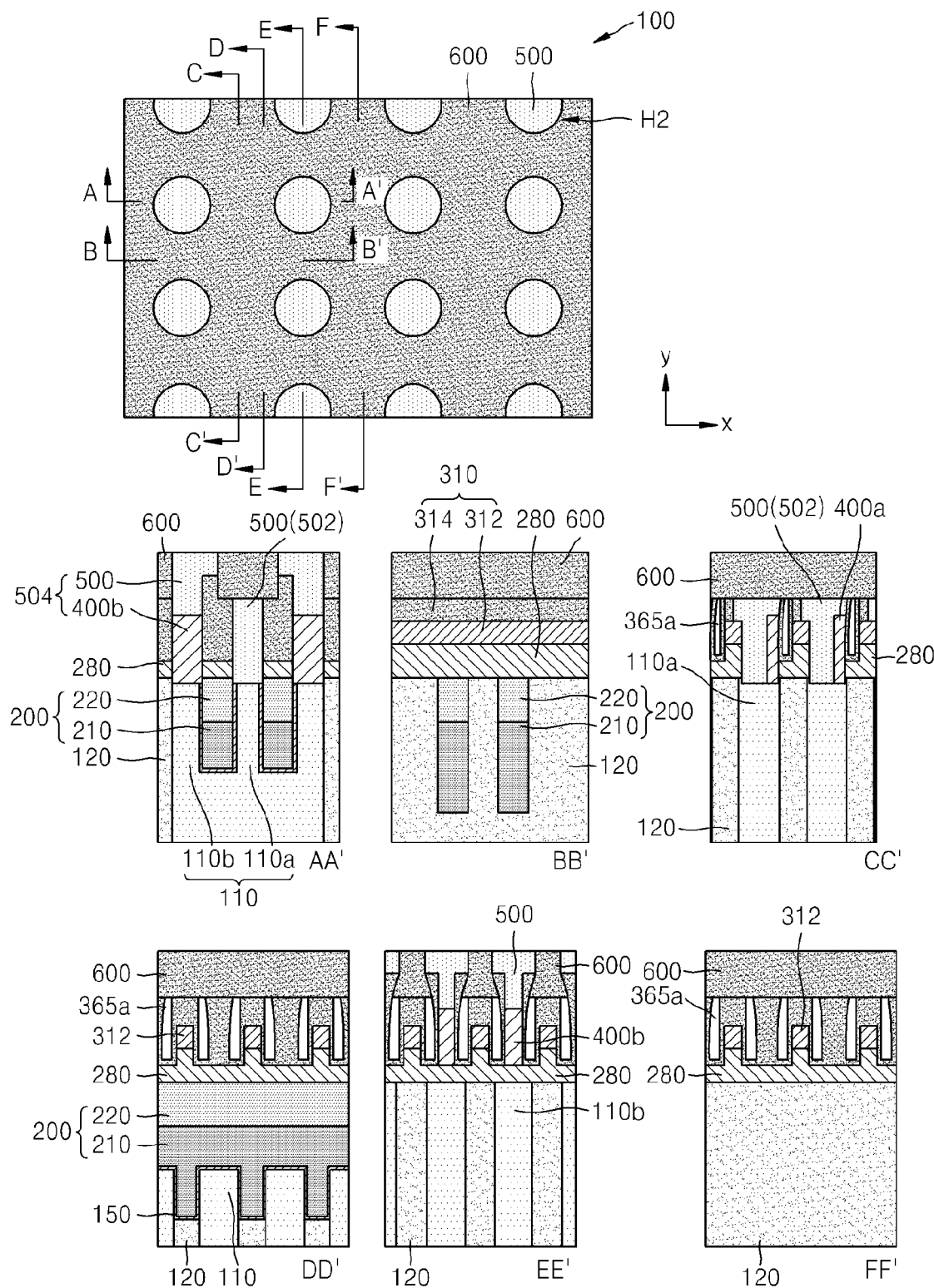

FIGS. 24 through 26 are plan views and cross-sectional views illustrating a method of manufacturing a semiconductor device including a conductive plug on which an air spacer is formed, according to a further example embodiment of the inventive concepts. In detail, the method of FIGS. 24 through 26 is almost the same as the method of manufacturing a semiconductor device including a conductive plug of FIGS. 10 through 19 except FIGS. 12, 17, and 18, and thus the following explanation will focus on a difference from FIGS. 12, 17, and 18.

Referring to FIG. 24, a spacer layer 320a that covers both side walls of each of the plurality of bit lines 312 is formed. The spacer layer 320a may cover both side walls of both the bit line 312 and the capping layer 314. A sacrificial layer 360 may be formed in the spacer layer 320a. The sacrificial layer 360 may be formed to be completely sealed by the spacer layer 320a. The sacrificial layer 360 may be formed of, for example, silicon oxide, silicon germanium (SiGe) compound, or polymer. However, the present example embodiment is not limited thereto. The sacrificial layer 360 may be formed of, for example, a material having an etch selectivity with respect to the spacer layer 320a.

In order to form the sacrificial layer 360 in the spacer layer 320a, a first insulating liner material layer that makes exposed surfaces of the bit line 312, the capping layer 316, and the interlayer insulating film pattern 280 have a uniform thickness may be formed, the sacrificial layer 360 may be formed as a spacer, and then a second insulating liner material layer that covers the sacrificial layer 360 may be formed. Portions of the first insulating liner material layer and the second insulating liner material which surround the sacrificial layer 360 may correspond to the spacer layer 320a, and other portions of the first insulating liner material layer and the second insulating liner material which surround a surface of the interlayer insulating film pattern 280 may correspond to an insulating liner layer 330.

However, a method of manufacturing the sacrificial layer 360 is not limited thereto, and any method of manufacturing the sacrificial layer 360 for forming an air spacer may be used.

Referring to FIGS. 24 and 25, a portion of the sacrificial layer 360 is exposed when portions of the capping layer 314/the spacer layer 320/the surround insulating film pattern 340, and the second plug material layer 500 are removed as shown in FIG. 17. Next, a gap 365 is formed in a portion where the sacrificial layer 360 is formed by removing the sacrificial layer 360 through an exposed portion of the sacrificial layer 360.

When the sacrificial layer 360 has a spacer shape, an upper portion of the sacrificial layer 360 may be thinner than a lower portion of the sacrificial layer 360. Assuming that a portion of the sacrificial layer 360 is to be exposed, when the upper portion, which is relatively thin, of the sacrificial layer 360 remains, an upper portion of the gap 365 may also be thinner than a lower portion of the gap 365.

Referring to FIGS. 25 and 26, a cover layer 600 is formed as shown in FIG. 18. An air spacer 365a is formed by forming the cover insulating layer 600 not to cover the entire gap 365. When the upper portion of the gap 365 is thinner than the lower portion of the gap 365 as described above, since the upper portion of the gap 365 is first covered when the cover insulating layer 600 is formed, the air spacer 365 may be formed without covering the remaining lower portion of the gap 365. Accordingly, referring to FIGS. 24 through 26, the air spacer 365a may be formed by removing the sacrificial layer 360 that is formed in the spacer layer 320a. That is, as a result, the air spacer 365 may be formed in the spacer layer 320a.

Although the method of FIGS. 24 through 26 has been described by focusing on a difference from the method of manufacturing a semiconductor device including a conductive plug of FIGS. 10 through 19, the same may apply to the methods of each manufacturing a semiconductor device including a conductive plug of FIGS. 20, 21, 22, and 23. Accordingly, the air spacer 365a may be formed on each of the semiconductor devices 2 through 4 of FIGS. 2 through 4 as well as the semiconductor device 1 of FIG. 1.

The semiconductor devices 5, 6, 7, and 8 of FIGS. 5, 6, 8, and 9 may be manufactured by using the methods of FIGS. 10 through 26, and thus a detailed explanation of a method of manufacturing the semiconductor devices 5, 6, 7, and 8 of FIGS. 5, 6, 8, and 9 will not be given.

For example, the semiconductor devices 5 and 6 of FIGS. 5 and 6 may be formed by forming a gate line structure, similar to the bit line structure 300, on the substrate on which the gate insulating film is formed and then forming the first conductive plug 400a and the second conductive plug 502 in a similar method.

Also, for example, the semiconductor devices 7 and 8 of FIGS. 8 and 9 may be formed by forming a wiring line structure, similar to the bit line structure 300, on the substrate on which the wiring line and the IMD layer are formed, and then forming the first conductive plug 400a and the second conductive plug 502 in a similar method.

Figure 27:
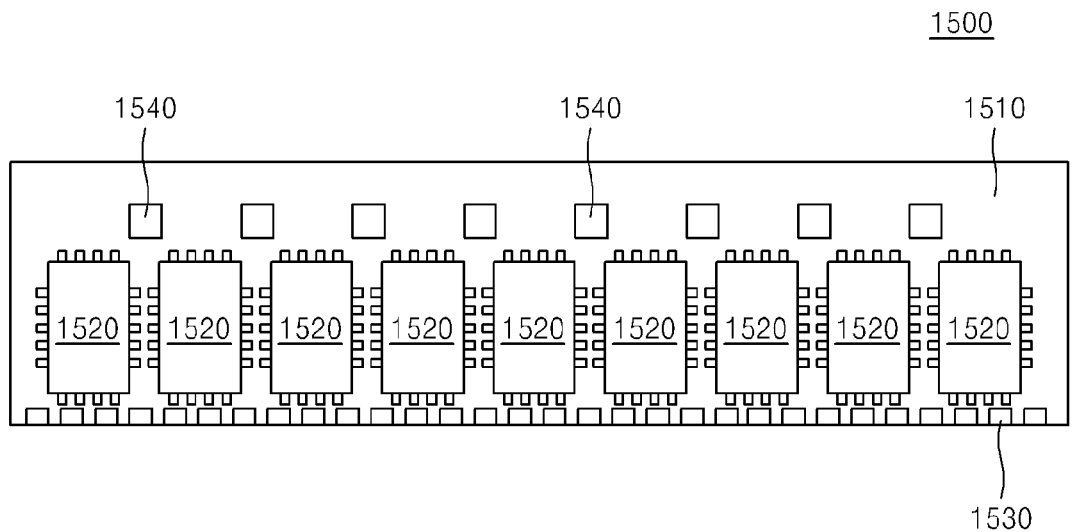
FIG. 27 is a plan view illustrating a memory module including a semiconductor device including a conductive plug, according to an example embodiment of the inventive concepts.

FIG. 27 is a plan view illustrating a memory module including a semiconductor device including a conductive plug, according to an example embodiment of the inventive concepts.

Referring to FIG. 27, a memory module 1500 includes a module substrate 1510, and a plurality of semiconductor chips 1520 that are attached to the module substrate 1510.

Each of the semiconductor chips 1520 includes a semiconductor device according to the inventive concepts. For example, the semiconductor chip 1520 may include any of the semiconductor devices 1, 2, 3, 4, 5, and 6 of FIGS. 1 through 6.

A connection unit 1530 that may be inserted into a socket of a mother board is disposed on a side of the module substrate 1510. A ceramic decoupling capacitor 1540 is disposed on the module substrate 1510. The memory module 1500 is not limited to that of FIG. 27, and may be manufactured in various ways.

Figure 28:
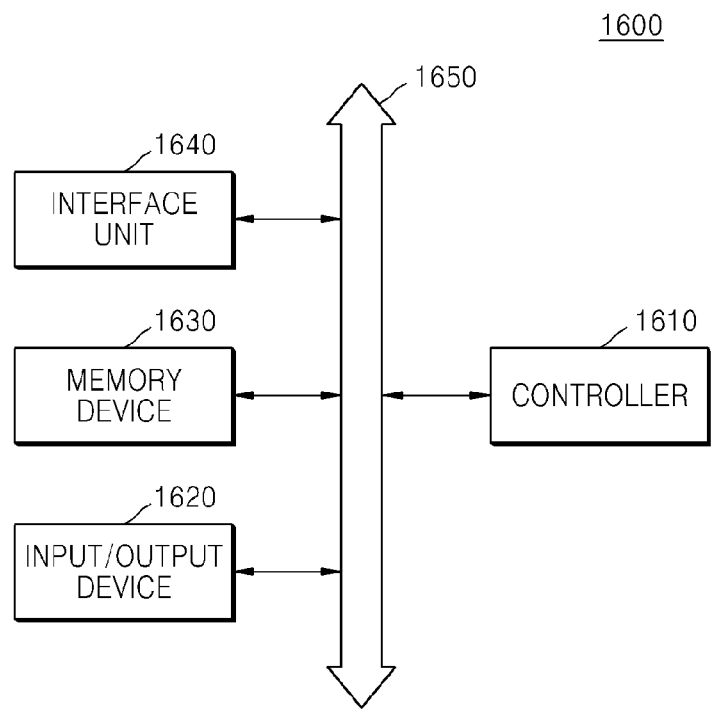
FIG. 28 is a block diagram illustrating a system including a semiconductor device including a conductive plug, according to an example embodiment of the inventive concepts.

FIG. 28 is a block diagram illustrating a system including a semiconductor device including a conductive plug, according to an example embodiment of the inventive concepts.

Referring to FIG. 28, a system 1600 includes a controller 1610, an input/output device 1620, a memory device 1630, and an interface unit 1640. The system 1600 may be a mobile system or a system that transmits or receives information. In an example embodiment, the mobile system is a personal digital assistant (PDA), a portable computer, a web tablet, a wireless phone, a mobile phone, a digital music player, or a memory card. The controller 1610 for controlling an execution program of the system 1600 may be a microprocessor, a digital signal processor, a microcontroller, or the like. The controller 1610 may include any of the semiconductor devices 5, 6, 7 and 8 of FIGS. 5, 6, 8, and 9. The input/output device 1620 may be used to input or output data of the system 1600. The system 1600 may be connected to an external device, for example, a personal computer or a network, and may exchange data with the external device, by using the input/output device 1620. The input/output device 1620 may be, for example, a keypad, a keyboard, or a display device.

The memory device 1630 may store codes and/or data for operating the controller 1610, or store data processed by the controller 1610. The memory device 1630 includes a semiconductor device according to the inventive concepts. For example, the memory device 1630 may include any of the semiconductor devices 1, 2, 3, 4, 5, and 6 of FIGS. 1 through 6.

The interface unit 1640 may be a data transmission path between the system 1600 and an external device. The controller 1610, the input/output device 1620, the memory device 1630, and the interface unit 1640 may communicate with one another via a bus 1650. The system 1600 may be a mobile phone, an MP3 player, a navigation system, a portable multimedia player (PMP), a solid-state disk (SSD), or a household appliance.

Figure 29:
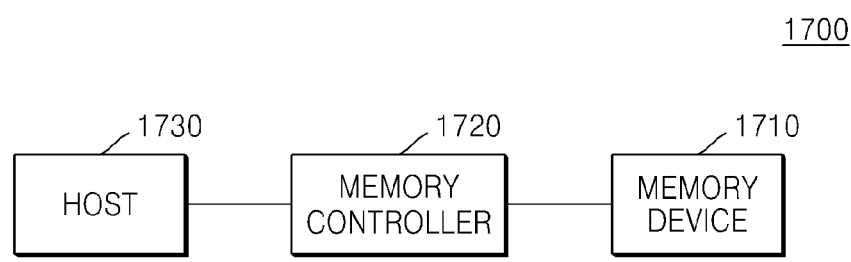
FIG. 29 is a block diagram illustrating a memory card including a semiconductor device including a conductive plug, according to an example embodiment of the inventive concepts.

FIG. 29 is a block diagram illustrating a memory card including a semiconductor device including a conductive plug, according to an example embodiment of the inventive concepts.

Referring to FIG. 29, a memory card 1700 includes a memory device 1710, and a memory controller 1720.

The memory device 1710 may store data. In an example embodiment, the memory device 1710 may have nonvolatile characteristics that may retain stored data even when power supply is cut off. The memory device 1710 includes a semiconductor device according to at least one example embodiment of the inventive concepts. For example, the memory device 1710 may include any of the semiconductor devices 1, 2, 3, 4, 5 and 6 of FIGS. 1 through 6.

The memory controller 1720 may read data from the memory device 1710 or write data to the memory device 1710 in response to a read/write request of a host 1730. The memory controller 1720 may include any of the semiconductor devices 5, 6, 7, and 8 of FIGS. 5, 6, 8, and 9.

According to at least one embodiment of a semiconductor device of the inventive concepts, since conductive plugs for connecting a conductive line and a structure disposed under the conductive line include a first conductive plug that is self-aligned and a second conductive plug that connects the first conductive plug and the conductive line through a side wall, contact resistance between the conductive line and the structure disposed between the conductive line may be reduced. Because misalignment, which may occur in a process of forming the second conductive plug, does not affect electrical connection between the conductive line and the first conductive plug, manufacturing costs may be reduced and yield may be improved. Also, even when the semiconductor device is shrunk, contact resistance is ensured, thereby making it possible to further miniaturize the semiconductor device.

While the inventive concepts has been particularly shown and described with reference to example embodiments thereof, it will be understood that various changes in form and details may be made therein without departing from the spirit and scope of the following claims.

What is claimed is:

1. A semiconductor device, comprising:
   a substrate including a target connection region;
   a conductive line having a first side wall, the conductive line being spaced apart from the substrate by at least an insulating layer; and
   a conductive plug structure electrically connecting the conductive line to the target connection region,
   the conductive plug structure including,
      a first conductive plug having a first side wall, a bottom surface contacting the target connection region of the substrate and a second side wall facing the first side wall of the conductive line, and
      a second conductive plug between the conductive line and the first conductive plug, the second conductive plug contacting both the first side wall of the conductive line and the second side wall of the first conductive plug, and the second conductive plug extending into the insulating layer along the first side wall of the conductive line.

2. The semiconductor device of claim 1, wherein the second conductive plug penetrates the insulating layer and contacts the target connection region of the substrate.

3. The semiconductor device of claim 1, wherein the second conductive plug contacts a top surface and the first side wall of the conductive line.

4. The semiconductor device of claim 1, wherein the second conductive plug contacts a top surface and the second side wall of the first conductive plug.

5. The semiconductor device of claim 1, wherein the first conductive plug and the second conductive plug have top surfaces at a same level based on a distance from the substrate.

6. The semiconductor device of claim 1, wherein
   the target connection region is an active region, and
   the conductive line is a bit line or a word line.

7. The semiconductor device of claim 1, wherein
   the substrate has a recess region crossing the target connection region in plan view, the recess region extending in a direction different from a direction in which the conductive line extends in plan view,
   the direction in which the conductive line extends is parallel to a main surface of the substrate, and
   a buried gate line is in the recess region.

8. The semiconductor device of claim 7, wherein
the target connection region including a first connection region contacting the first conductive plug, and a second connection region spaced apart from the first connection region by the buried gate line,
a third conductive plug contacts the second connection region, and
a capacitor structure is on and connected to the third conductive plug.

9. The semiconductor device of claim 1, wherein
the conductive line extends in a first direction, and
a plurality of the target connection regions are aligned on the substrate in a second direction, the second direction being different from the first direction.

10. The semiconductor device of claim 9, wherein a plurality of the conductive plug structures are each aligned in the first direction to correspond to a respective one of the plurality of target connection regions.

11. The semiconductor device of claim 1, wherein
the target connection region is an active region of the substrate, and
the conductive line is a gate line.

12. The semiconductor device of claim 1, wherein
the target connection region is a wiring line over the substrate, and
the conductive line is over the wiring line.

13. A semiconductor device, comprising:
a substrate including a target connection region;
an insulating layer over the substrate;
a first conductive line structure and a second conductive line structure each over the insulating layer, each of the first conductive line structure and the second conductive line structure including,
a conductive line,
a capping layer over the conductive line, and
a spacer layer covering at least one side wall of the conductive line,
the first conductive line structure and the second conductive line structure extending in a direction parallel to a main surface of the substrate and spaced apart from each other; and
a first conductive plug and a second conductive plug between the first conductive line structure and the second conductive line structure,
the first conductive plug contacting the spacer layer of the second conductive line structure and extending toward the substrate such that the first conductive plug is connected to the target connection region, and
the second conductive plug penetrating the spacer layer of the first conductive line structure to contact a side wall of the conductive line of the first conductive line structure, and contacting the first conductive plug such that the second conductive plug is electrically connected to the target connection region.

14. The semiconductor device of claim 13, wherein the spacer layer includes a spacer made of air.

* * * * *